(12) United States Patent
Sasaki et al.

(10) Patent No.: US 8,587,125 B2
(45) Date of Patent: Nov. 19, 2013

(54) METHOD OF MANUFACTURING LAYERED CHIP PACKAGE

(75) Inventors: Yoshitaka Sasaki, Milpitas, CA (US); Hiroyuki Ito, Milpitas, CA (US); Atsushi Iijima, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 189 days.

(21) Appl. No.: 12/869,471

(22) Filed: Aug. 26, 2010

(65) Prior Publication Data

US 2011/0180932 A1 Jul. 28, 2011

Related U.S. Application Data

(63) Continuation-in-part of application No. 12/692,270, filed on Jan. 22, 2010, now abandoned.

(51) Int. Cl.
| | |
|---|---|
| *H01L 23/02* | (2006.01) |
| *H01L 23/34* | (2006.01) |
| *H01L 23/48* | (2006.01) |
| *H01L 23/52* | (2006.01) |
| *H01L 29/40* | (2006.01) |
| *H01L 21/00* | (2006.01) |

(52) U.S. Cl.
USPC ........... 257/774; 257/686; 257/723; 257/787; 257/E21.577; 257/E23.011; 438/113

(58) Field of Classification Search
USPC .......... 257/686, 723, 787, E25.006, E25.013, 257/E25.018, E25.021, E25.027, E23.085, 257/774; 438/109, 110, 113
See application file for complete search history.

(56) References Cited

U.S. PATENT DOCUMENTS

| | | | |
|---|---|---|---|
| 5,953,588 A | 9/1999 | Camien et al. | |
| 7,127,807 B2 | 10/2006 | Yamaguchi et al. | |
| 7,745,259 B2 * | 6/2010 | Sasaki et al. | 438/109 |
| 7,877,874 B2 | 2/2011 | Val | |
| 2001/0021543 A1 * | 9/2001 | Neu et al. | 438/110 |
| 2002/0109133 A1 * | 8/2002 | Hikita et al. | 257/10 |

(Continued)

FOREIGN PATENT DOCUMENTS

| | | | |
|---|---|---|---|
| JP | A 2001-177047 | | 6/2001 |
| JP | A 2009-521116 | | 5/2009 |
| JP | 2011151365 A | * | 8/2011 |

OTHER PUBLICATIONS

Gann, "Neo-Stacking Technology," HDI Magazine, Dec. 1999.

*Primary Examiner* — Teresa M Arroyo
(74) *Attorney, Agent, or Firm* — Oliff & Berridge, PLC

(57) ABSTRACT

A layered chip package includes a main body, and wiring including a plurality of wires disposed on a side surface of the main body. The main body includes a plurality of semiconductor chips stacked, and a plurality of electrodes that electrically connect the semiconductor chips to the wires. A method of manufacturing the layered chip package includes the steps of: fabricating a substructure that includes an array of a plurality of pre-separation main bodies and a plurality of holes for accommodating a plurality of preliminary wires, the holes being formed between two adjacent pre-separation main bodies; forming the preliminary wires in the plurality of holes by plating; and cutting the substructure so that the plurality of pre-separation main bodies are separated from each other and the preliminary wires are split into two sets of wires of two separate main bodies, whereby a plurality of layered chip packages are formed.

4 Claims, 31 Drawing Sheets

(56) References Cited

U.S. PATENT DOCUMENTS

| | | | |
|---|---|---|---|
| 2004/0207049 A1* | 10/2004 | Bauer et al. | 257/620 |
| 2009/0305464 A1* | 12/2009 | Howard et al. | 438/109 |
| 2010/0261313 A1* | 10/2010 | Toh et al. | 438/109 |
| 2011/0316141 A1* | 12/2011 | Sasaki et al. | 257/700 |

\* cited by examiner

هذه

# METHOD OF MANUFACTURING LAYERED CHIP PACKAGE

This is a Continuation-in-Part of application Ser. No. 12/692,270 filed Jan. 22, 2010 now abandoned. The disclosure of the prior application is hereby incorporated by reference herein in its entirety.

BACKGROUND OF THE INVENTION

1. Field of the Invention

The present invention relates to a method of manufacturing a layered chip package that includes a plurality of semiconductor chips stacked, and to a substructure for use in the method.

2. Description of the Related Art

In recent years, a reduction in weight and an improvement in performance have been demanded of mobile devices typified by cellular phones and notebook personal computers. Accordingly, there has been a demand for higher integration of electronic components for use in mobile devices. Higher integration of electronic components has been demanded also for achieving an increase in capacity of semiconductor memory.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package that includes a plurality of semiconductor chips (hereinafter, also simply referred to as chips) stacked is called a layered chip package. Since the layered chip package allows a reduction in wiring length, it provides the advantage of allowing acceleration of the operation of circuits and a reduction in stray capacitance of wiring, as well as the advantage of allowing higher integration.

Major examples of the three-dimensional packaging technology for fabricating a layered chip package include a wire bonding method and a through electrode method. According to the wire bonding method, a plurality of chips are stacked on a substrate, and a plurality of electrodes formed on each chip are connected to external connecting terminals formed on the substrate by wire bonding. According to the through electrode method, a plurality of through electrodes are formed in each of the chips to be stacked and inter-chip wiring is performed through the use of the through electrodes.

The wire bonding method has the problem that it is difficult to reduce the distance between the electrodes so as to avoid contact between wires, and the problem that the high resistances of the wires hinder the acceleration of the operation of circuits.

The through electrode method is free from the above-mentioned problems of the wire bonding method. Unfortunately, however, the through electrode method requires a large number of steps for forming the through electrodes in chips, and consequently increases the cost for the layered chip package. According to the through electrode method, forming the through electrodes in chips requires a series of steps as follows: forming a plurality of holes for the plurality of through electrodes in a wafer that is to be cut later into a plurality of chips; forming an insulating layer and a seed layer in the plurality of holes and on the top surface of the wafer; forming the through electrodes by filling the plurality of holes with metal such as Cu by plating; and removing unwanted portions of the seed layer.

According to the through electrode method, the through electrodes are formed by filling metal into holes having relatively high aspect ratios. Consequently, voids or keyholes are prone to occur in the through electrodes due to poor filling of the holes with metal. This tends to reduce the reliability of wiring formed by the through electrodes.

According to the through electrode method, an upper chip and a lower chip are physically joined to each other by connecting the through electrodes of the upper and lower chips by means of, for example, soldering. The through electrode method therefore requires that the upper and lower chips be accurately aligned and then joined to each other at high temperatures. When the upper and lower chips are joined to each other at high temperatures, however, misalignment between the upper and lower chips can occur due to expansion and contraction of the chips, which often results in electrical connection failure between the upper and lower chips.

U.S. Pat. No. 5,953,588 discloses a method of manufacturing a layered chip package as described below. In this method, a plurality of chips cut out from a processed wafer are embedded into an embedding resin and then a plurality of leads are formed to be connected to each chip, whereby a structure called a neo-wafer is fabricated. Next, the neo-wafer is diced into a plurality of structures each called a neo-chip. Each neo-chip includes one or more chips, resin surrounding the chip(s), and a plurality of leads. The plurality of leads connected to each chip each have an end face exposed at a side surface of the neo-chip. Next, a plurality of types of neo-chips are laminated into a stack. In the stack, the respective end faces of the plurality of leads connected to the chips of each layer are exposed at the same side surface of the stack.

The manufacturing method disclosed in U.S. Pat. No. 5,953,588 requires a large number of steps and this raises the cost for the layered chip package. According to the method, after a plurality of chips cut out from a processed wafer are embedded into the embedding resin, a plurality of leads are formed to be connected to each chip to thereby fabricate the neo-wafer, as described above. Accurate alignment between the plurality of chips is therefore required when fabricating the neo-wafer. This is also a factor that raises the cost for the layered chip package.

Keith D. Gann, "Neo-Stacking Technology", HDI Magazine, December 1999, discloses fabricating a stack by the same method as that disclosed in U.S. Pat. No. 5,953,588, and forming wiring on two side surfaces of the stack. Forming wiring on the side surfaces of each individual stack as in this method has the problem of higher cost of the layered chip package because a large number of steps are required for forming the wiring when manufacturing a large number of layered chip packages.

U.S. Pat. No. 7,127,807 B2 discloses a multilayer module formed by stacking a plurality of active layers each including a flexible polymer substrate with at least one electronic element and a plurality of electrically-conductive traces formed within the substrate. U.S. Pat. No. 7,127,807 B2 further discloses a manufacturing method for a multilayer module as described below. In the manufacturing method, a module array stack is fabricated by stacking a plurality of module arrays each of which includes a plurality of multilayer modules arranged in two orthogonal directions. The module array stack is then cut into a module stack which is a stack of a plurality of multilayer modules. Next, a plurality of electrically-conductive lines are formed on the respective side surfaces of the plurality of multilayer modules included in the module stack. The module stack is then separated from each other into individual multilayer modules.

The manufacturing method for a multilayer module disclosed in U.S. Pat. No. 7,127,807 B2 allows forming a plurality of electrically-conductive lines simultaneously on a plurality of multilayer modules included in the module stack. It is therefore possible to reduce the number of steps for forming the electrically-conductive lines as compared with the case of forming a plurality of electrically-conductive lines on one multilayer module after another. Such a method, however, involves the step of forming the electrically-conductive lines on each of a plurality of module stacks which are obtained by cutting the module array stack. The method therefore still has a large number of steps for forming the electrically-conductive lines with the problem of higher cost of the multilayer module.

OBJECT AND SUMMARY OF THE INVENTION

It is an object of the present invention to provide a manufacturing method for a layered chip package that makes it possible to mass-produce a layered chip package at low cost in a short period of time, the layered chip package having wiring on a side surface of its main body including a stack of a plurality of semiconductor chips, and to provide a substructure for use in the manufacturing method.

A layered chip package to be manufactured by a manufacturing method of the present invention includes: a main body having a top surface, a bottom surface, and four side surfaces; and wiring that includes a plurality of wires disposed on at least one of the side surfaces of the main body. The main body includes: a plurality of semiconductor chips stacked, each of the semiconductor chips having a top surface, a bottom surface and four side surfaces; an insulating portion that covers at least one of the four side surfaces of each of the plurality of semiconductor chips and forms the at least one of the side surfaces of the main body on which the wires are disposed; and a plurality of electrodes that electrically connect at least one of the semiconductor chips to the wires. The manufacturing method of the present invention is a method of manufacturing a plurality of such layered chip packages.

The method of manufacturing the layered chip packages of the present invention includes the steps of:

fabricating a substructure that includes: an array of a plurality of pre-separation main bodies that are intended to be separated from each other later into individual main bodies; and a plurality of holes for accommodating a plurality of preliminary wires, the holes being formed between two adjacent pre-separation main bodies;

forming the preliminary wires in the plurality of holes of the substructure by plating; and cutting the substructure so that the plurality of pre-separation main bodies are separated from each other and the preliminary wires are cut into the wires of at least one main body, whereby the plurality of layered chip packages are formed.

In the method of manufacturing the layered chip packages of the present invention, in the step of cutting the substructure, the preliminary wires may be split into two sets of wires of two separate main bodies. In such a case, each of the plurality of pre-separation main bodies may include a plurality of preliminary electrodes that are intended to later become the plurality of electrodes. In the substructure, the respective plurality of preliminary electrodes of two adjacent pre-separation main bodies may be connected to each other. In this case, the respective plurality of preliminary electrodes of the two pre-separation main bodies connected to each other are separated from each other into the respective plurality of electrodes of two separate main bodies when the substructure is cut.

In the method of manufacturing the layered chip packages of the present invention, the step of fabricating the substructure may include the steps of: fabricating an initial substructure that is intended to undergo the formation of the plurality of holes therein later to thereby become the substructure; and forming the substructure by forming the plurality of holes in the initial substructure.

The initial substructure may be fabricated by stacking a plurality of chip arrays each of which includes: an array of a plurality of pre-semiconductor-chip portions, each of the pre-semiconductor-chip portions being intended to become any one of the semiconductor chips included in the main body; and an insulating layer disposed between two adjacent pre-semiconductor-chip portions.

Alternatively, the initial substructure may be fabricated by arraying a plurality of stacks each of which includes a stack of the plurality of semiconductor chips to be included in the main body, and then connecting the plurality of stacks to each other by forming an insulating layer between adjacent stacks.

In the method of manufacturing the layered chip packages of the present invention, the insulating portion may be formed of a resin.

A substructure of the present invention is for use in manufacturing a plurality of layered chip packages described above. The substructure includes: an array of a plurality of pre-separation main bodies that are intended to be separated from each other later into individual main bodies; and a plurality of holes for accommodating a plurality of preliminary wires, the holes being formed between two adjacent pre-separation main bodies. After the preliminary wires are formed in the plurality of holes, the substructure is cut so that the plurality of pre-separation main bodies are separated from each other and the preliminary wires are cut into the wires of at least one main body, whereby the plurality of layered chip packages are formed. The insulating portion may be formed of a resin.

In the substructure of the present invention, the preliminary wires may be split into two sets of wires of two separate main bodies when the substructure is cut. In such a case, each of the plurality of pre-separation main bodies may include a plurality of preliminary electrodes that are intended to later become the plurality of electrodes, and the respective plurality of preliminary electrodes of two adjacent pre-separation main bodies may be connected to each other. In this case, the respective plurality of preliminary electrodes of the two pre-separation main bodies connected to each other are separated from each other into the respective plurality of electrodes of two separate main bodies when the substructure is cut.

The method of manufacturing the layered chip packages of the present invention or the substructure of the present invention allows manufacturing a plurality of layered chip packages through a small number of steps, each of the layered chip packages having wiring on a side surface of its main body including a stack of a plurality of semiconductor chips. This is achieved by forming preliminary wires in a plurality of holes in a substructure before the substructure is cut. According to the present invention, it is thus possible to mass-produce the layered chip packages at low cost in a short period of time.

Other and further objects, features and advantages of the present invention will appear more fully from the following description.

DETAILED DESCRIPTION OF THE PREFERRED EMBODIMENTS

First Embodiment

Figure 1:
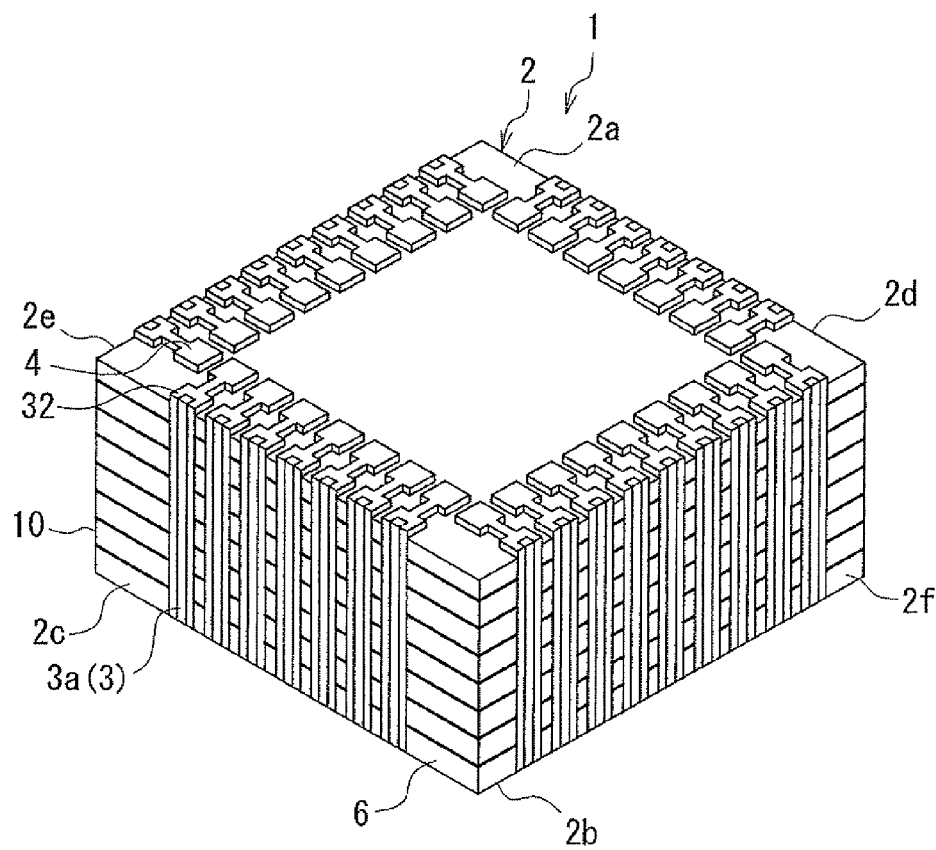
FIG. 1 is a perspective view of a layered chip package according to a first embodiment of the invention.

Preferred embodiments of the present invention will now be described in detail with reference to the drawings. Reference is first made to FIG. 1 to describe the configuration of a layered chip package according to a first embodiment of the invention. FIG. 1 is a perspective view of the layered chip package according to the present embodiment.

As shown in FIG. 1, the layered chip package 1 according to the present embodiment includes a main body 2 that is generally rectangular-solid-shaped. The main body 2 has a top surface 2a, a bottom surface 2b, and four side surfaces 2c, 2d, 2e, and 2f. The layered chip package 1 further includes wiring 3 that includes a plurality of wires 3a disposed on at least one of the side surfaces of the main body 2. In the example shown in FIG. 1, the wires 3a are disposed on each of the four side surfaces 2c, 2d, 2e, and 2f of the main body 2.

The main body 2 includes a plurality of layer portions 10 stacked. By way of example, FIG. 1 shows the case where the main body 2 includes eight layer portions 10. The number of the layer portions 10 to be included in the main body 2 is not limited to eight, and may be any plural number.

Figure 2:
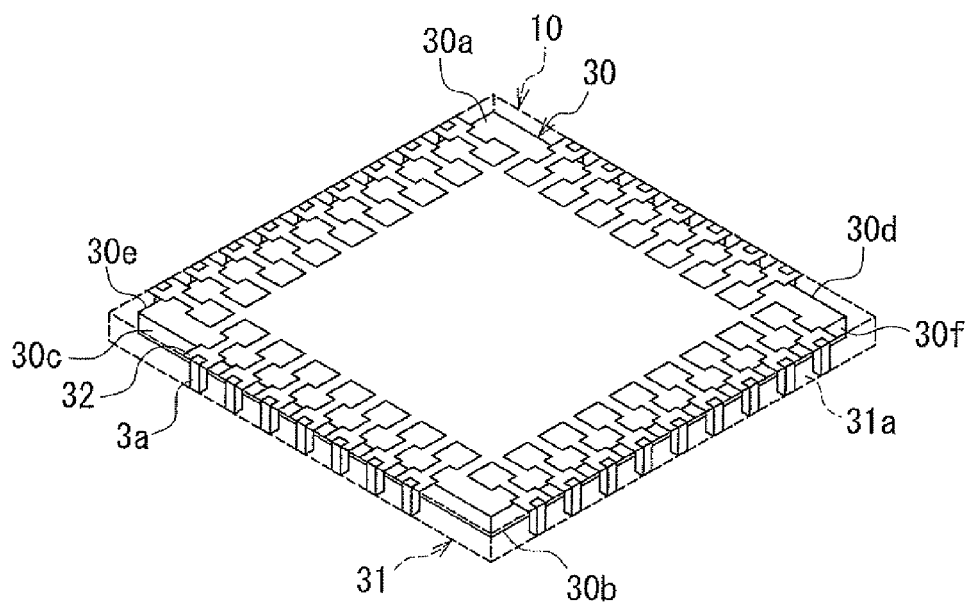
FIG. 2 is a perspective view showing one of layer portions of FIG. 1.

FIG. 2 is a perspective view showing one of the layer portions 10 of FIG. 1. As shown in FIG. 2, the layer portion 10 includes a semiconductor chip 30. The semiconductor chip 30 has a top surface 30a, a bottom surface 30b, and four side surfaces 30c, 30d, 30e, and 30f. The side surfaces 30c, 30d, 30e, and 30f respectively face toward the side surfaces 2c, 2d, 2e, and 2f of the main body 2.

The layer portion 10 further includes an insulating layer 31 that covers at least one of the four side surfaces of the semiconductor chip 30. The insulating layer 31 has at least one end face 31a that is located in the at least one of the side surfaces of the main body 2 on which the wires 3a are disposed. In the example shown in FIG. 2, the insulating layer 31 covers all of the four side surfaces of the semiconductor chip 30, and has four end faces 31a located in the four side surfaces of the main body 2. The insulating layer 31 also covers the top surface 30a of the semiconductor chip 30.

At least one of the plurality of layer portions 10 included in the main body 2 further includes a plurality of electrodes 32 that electrically connect the semiconductor chip 30 to the wires 3a. At least another one of the plurality of layer portions 10 included in the main body 2 may be without the plurality of electrodes 32. A layer portion 10 that includes the plurality of electrodes 32 will be hereinafter referred to as a first-type layer portion and designated by reference numeral 10A. A layer portion 10 that does not include the plurality of electrodes 32 will be hereinafter referred to as a second-type layer portion and designated by reference numeral 10B. The semiconductor chip 30 of the first-type layer portion 10A is a normally functioning one, whereas the semiconductor chip 30 of the second-type layer portion 10B is a malfunctioning one. Hereinafter, a normally functioning semiconductor chip 30 will be referred to as a conforming semiconductor chip 30, and a malfunctioning semiconductor chip 30 will be referred to as a defective semiconductor chip 30.

The main body 2 includes: a plurality of semiconductor chips 30 that are stacked; an insulating portion 6 that covers at least one of the four side surfaces of each of the plurality of semiconductor chips 30 and forms the at least one of the side surfaces of the main body 2 on which the wires 3a are disposed; and the plurality of electrodes 32 that electrically connect at least one of the semiconductor chips 30 to the wires 3a. The insulating portion 6 is formed by the insulating layers 31 of the plurality of layer portions 10. The insulating layers 31 and the insulating portion 6 are formed of a resin, for example.

The main body 2 further includes a plurality of terminals 4 that are disposed on at least one of the top surface 2a and the bottom surface 2b. The plurality of terminals 4 are electrically connected to the wires 3a. FIG. 1 shows an example where the main body 2 includes a plurality of terminals 4 disposed on the top surface 2a. The main body 2 may include a plurality of terminals 4 disposed on the bottom surface 2b. The main body 2 preferably includes a plurality of terminals 4 disposed on the top surface 2a and a plurality of terminals 4 disposed on the bottom surface 2b.

If the uppermost layer portion 10 in a main body 2 is the first-type layer portion 10A, the plurality of electrodes 32 of that layer portion 10 are not covered by the insulating layer 31 but are exposed. The electrodes 32 of the uppermost layer portion 10A also function as the terminals 4. Note that the uppermost layer portion 10 may also be configured so that the insulating layer 31 covers the electrodes 32 and that a plurality of terminals 4 are formed on the insulating layer 31 aside from the electrodes 32.

The second-type layer portion 10B may include any electrode or wiring as long as the electrode or wiring is other than one that is configured to electrically connect the semiconductor chip 30 to the wires 3a. For example, the second-type layer portion 10B may include an electrode that is electrically connected to the semiconductor chip 30 but not to the wires 3a, and/or wiring that is intended for connection between terminals of the semiconductor chip 30.

The semiconductor chip 30 may be a memory chip that constitutes a memory such as a flash memory, DRAM, SRAM, MRAM, PROM, or FeRAM. In such a case, it is possible to implement a large-capacity memory by using the layered chip package 1 including a plurality of semiconductor chips 30. With the layered chip package 1 according to the present embodiment, it is also possible to easily implement a memory of various capacities such as 64 GB (gigabytes), 128 GB, and 256 GB, by changing the number of the semiconductor chips 30 to be included in the layered chip package 1.

In the case where the semiconductor chip 30 includes a plurality of memory cells and where one or more of the memory cells are defective, the semiconductor chip 30 is still conforming if it can function normally by employing the redundancy technique.

The semiconductor chips 30 are not limited to memory chips, and may be used for implementing other devices such as CPUs, sensors, and driving circuits for sensors. The layered chip package 1 according to the present embodiment is particularly suitable for implementing an SiP.

Figure 3:
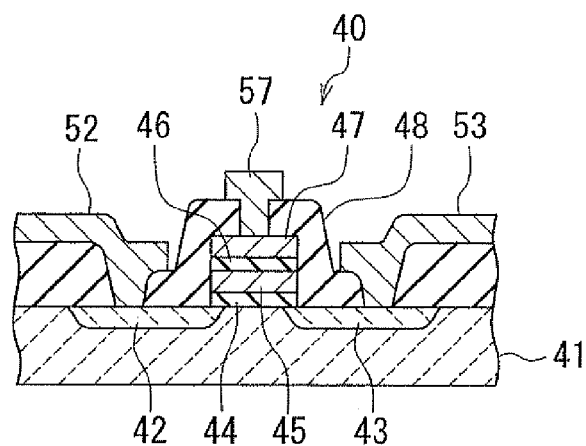
FIG. 3 is a cross-sectional view showing a part of the device included in the semiconductor chip.

Reference is now made to FIG. 3 to describe an example of device included in the semiconductor chip 30. By way of example, the following description will be given for a case where the device included in the semiconductor chip 30 is a circuit including a plurality of memory cells that constitute a memory. FIG. 3 shows one of the plurality of memory cells. The memory cell 40 includes a source 42 and a drain 43 formed near a surface of a P-type silicon substrate 41. The source 42 and the drain 43 are both N-type regions. The source 42 and the drain 43 are disposed at a predetermined distance from each other so that a channel composed of a part of the P-type silicon substrate 41 is provided between the source 42 and the drain 43. The memory cell 40 further includes an insulating film 44, a floating gate 45, an insulating film 46, and a control gate 47 that are stacked in this order on the surface of the substrate 41 at the location between the source 42 and the drain 43. The memory cell 40 further includes an insulating layer 48 that covers the source 42, the drain 43, the insulating film 44, the floating gate 45, the insulating film 46 and the control gate 47. The insulating layer 48 has contact holes that open in the tops of the source 42, the drain 43 and the control gate 47, respectively. The memory cell 40 includes a source electrode 52, a drain electrode 53, and a control gate electrode 57 that are formed on the insulating layer 48 at locations above the source 42, the drain 43 and the control gate 47, respectively. The source electrode 52, the drain electrode 53 and the control gate electrode 57 are connected to the source 42, the drain 43 and the control gate 47, respectively, through the corresponding contact holes.

Next, a description will be given of a method of manufacturing the layered chip package 1 according to the present embodiment. The method of manufacturing the layered chip package 1 includes the step of fabricating a substructure. As will be detailed later, the substructure includes an array of a plurality of pre-separation main bodies that are intended to be separated from each other later into individual main bodies 2, and a plurality of holes for accommodating a plurality of preliminary wires, the holes being formed between two adjacent pre-separation main bodies.

The method of manufacturing the layered chip package 1 further includes the steps of: forming the preliminary wires in the plurality of holes of the substructure by plating; and cutting the substructure so that the plurality of pre-separation main bodies are separated from each other and the preliminary wires are cut into the wires 3a of at least one main body 2, whereby a plurality of layered chip packages 1 are formed. In the step of cutting the substructure, the preliminary wires may be split into two sets of wires 3a of two separate main bodies 2. A description will now be given of the case where the preliminary wires are split into two sets of wires 3a of two separate main bodies 2.

The step of fabricating the substructure includes the steps of: fabricating an initial substructure that is intended to undergo the formation of the plurality of holes therein later to thereby become the substructure; and forming the substructure by forming the plurality of holes in the initial substructure.

Figure 4:
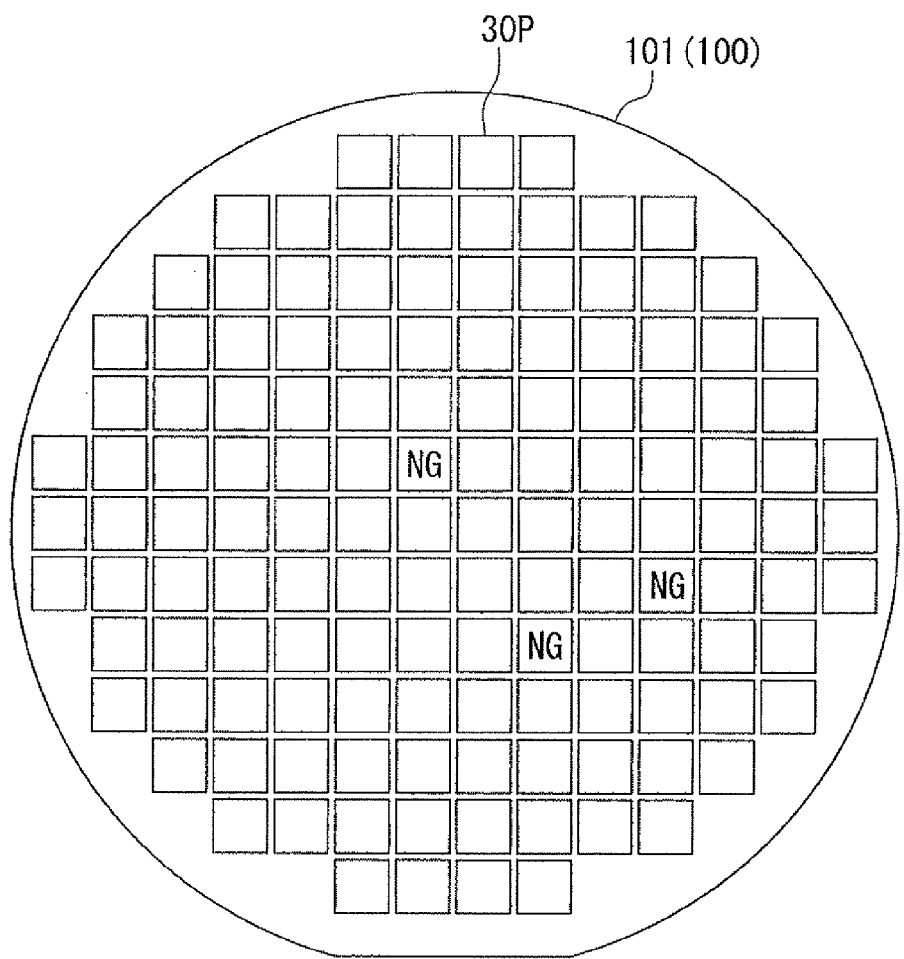
FIG. 4 is a plan view showing a pre-array wafer fabricated in a step of a method of manufacturing the layered chip package according to the first embodiment of the invention.
Figure 5:
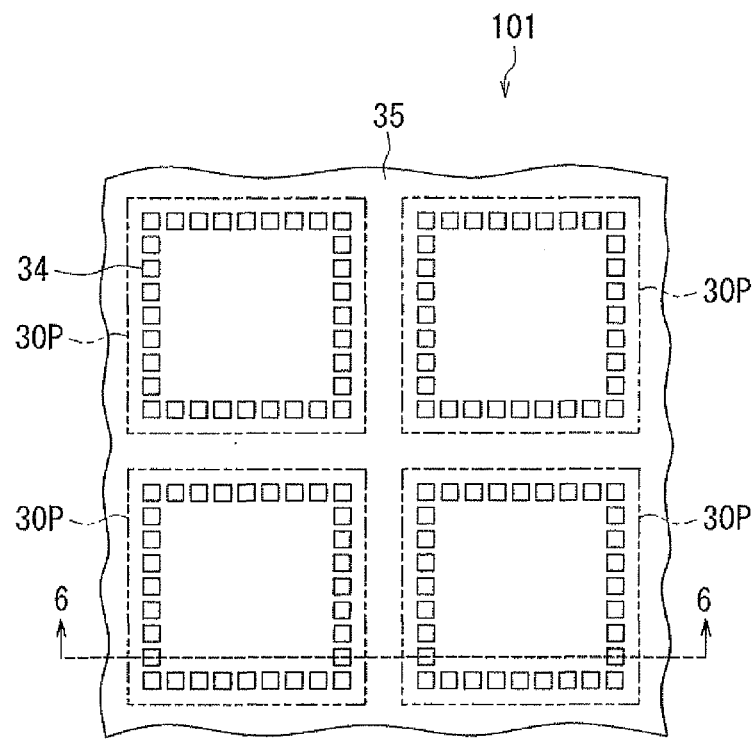
FIG. 5 is a magnified plan view showing a part of the pre-array wafer of FIG. 4.
Figure 6:
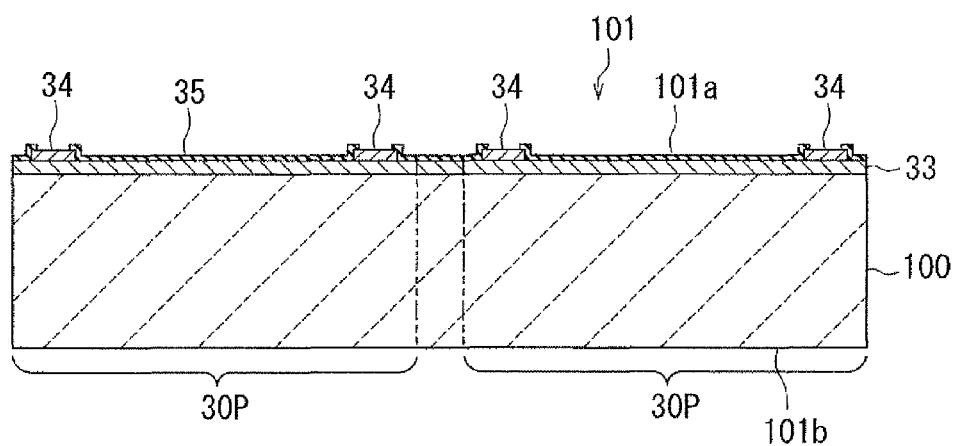
FIG. 6 shows a cross section taken along line 6-6 of FIG. 5.

The step of fabricating the initial substructure will now be described in detail with reference to FIG. 4 to FIG. 21. In the step of fabricating the initial substructure, a pre-array wafer 101 is initially fabricated. The pre-array wafer 101 includes an array of a plurality of pre-semiconductor-chip portions 30P that are intended to become individual semiconductor chips 30 to be included in the main body 2. FIG. 4 is a plan view of the pre-array wafer 101. FIG. 5 is a magnified plan view showing a part of the pre-array wafer 101 of FIG. 4. FIG. 6 shows a cross section taken along line 6-6 of FIG. 5.

Specifically, in the step of fabricating the pre-array wafer 101, a semiconductor wafer 100 having two surfaces that face toward opposite directions is subjected to processing, such as a wafer process, at one of the two surfaces. The pre-array wafer 101 including an array of a plurality of pre-semiconductor-chip portions 30P, each of the pre-semiconductor-chip portions 30P including a device, is thereby fabricated. In the pre-array wafer 101, the plurality of pre-semiconductor-chip portions 30P may be in a row, or in a plurality of rows such that a number of pre-semiconductor-chip portions 30P are arranged both in vertical and horizontal directions. In the following description, assume that the plurality of pre-semiconductor-chip portions 30P in the pre-array wafer 101 are in a plurality of rows such that a number of pre-semiconductor-chip portions 30P are arranged both in vertical and horizontal directions. The semiconductor wafer 100 may be a silicon wafer, for example. The wafer process is a process in which a semiconductor wafer is processed into a plurality of devices that are not yet separated into a plurality of chips. For ease of understanding, FIG. 4 depicts the pre-semiconductor-chip portions 30P larger relative to the semiconductor wafer 100. For example, if the semiconductor wafer 100 is a 12-inch wafer and the top surface of each pre-semiconductor-chip portion 30 is 8 to 10 mm long at each side, then 700 to 900 pre-semiconductor-chip portions 30P are obtainable from a single semiconductor wafer 100.

As shown in FIG. 6, the pre-semiconductor-chip portions 30P include a device-forming region 33 that is formed near one of the surfaces of the semiconductor wafer 100. The device-forming region 33 is a region where devices are formed by processing the one of the surfaces of the semiconductor wafer 100. The pre-semiconductor-chip portions 30P further include a plurality of electrode pads 34 that are arranged on the device-forming region 33, and a passivation film 35 that is made of an insulating material and disposed over the device-forming region 33. The passivation film 35 has a plurality of openings for exposing the top surfaces of the plurality of electrode pads 34. The plurality of electrode pads 34 are located in the positions corresponding to the plurality of electrodes 32 to be formed later, and are electrically connected to the devices formed in the device-forming region 33. Hereinafter, the surface of the pre-array wafer 101 located closer to the plurality of electrode pads 34 and the passivation film 35 will be referred to as a first surface 101a. The surface on the opposite side will be referred to as a second surface 101b.

In the step of fabricating the initial substructure, next, a wafer sort test is performed to distinguish the plurality of pre-semiconductor-chip portions 30P included in the pre-array wafer 101 into normally functioning pre-semiconductor-chip portions and malfunctioning pre-semiconductor-chip portions. In this step, a probe of a testing device is brought into contact with the plurality of electrode pads 34 of each pre-semiconductor-chip portion 30P, so that whether the pre-semiconductor-chip portion 30P functions normally or not is tested with the testing device. In FIG. 4, the pre-semiconductor-chip portions 30P marked with "NG" are malfunctioning ones, and the other pre-semiconductor-chip portions 30P are normally functioning ones. This step provides location information on the normally functioning pre-semiconductor-chip portions 30P and the malfunctioning pre-semiconductor-chip portions 30P in each pre-array wafer 101. The location information is used in an exposure step for forming a frame to be described later.

Figure 7:
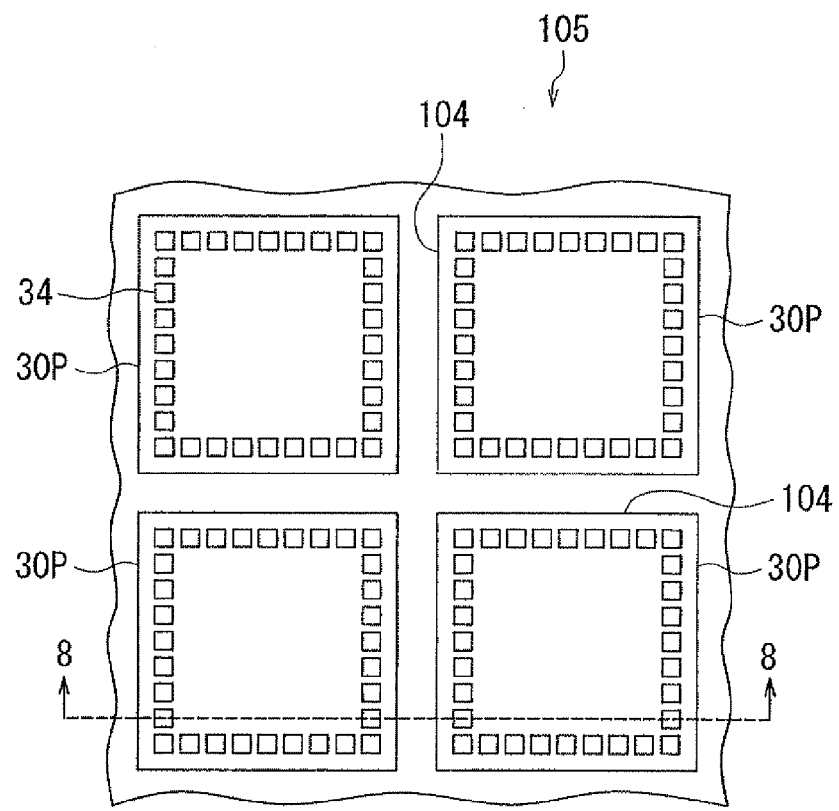
FIG. 7 is a plan view showing a step that follows the step of FIG. 5.
Figure 8:
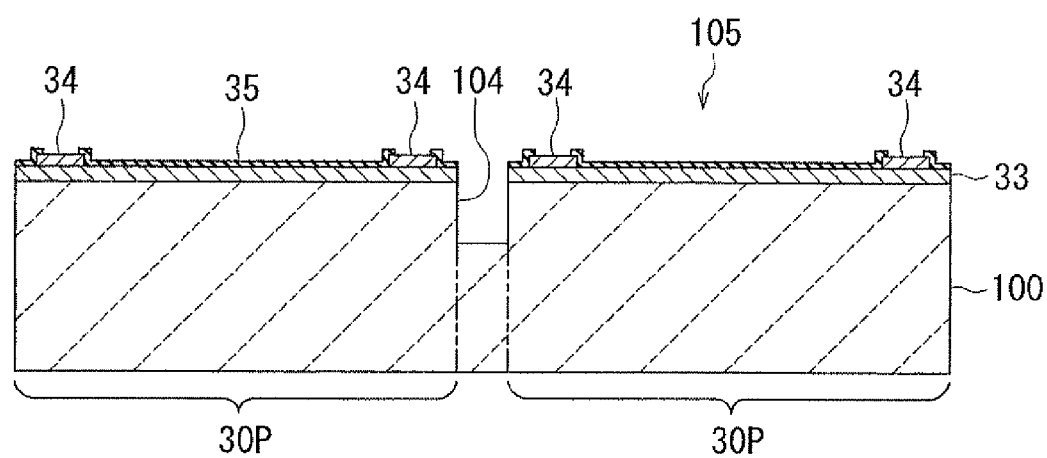
FIG. 8 shows a cross section taken along line 8-8 of FIG. 7.

FIG. 7 is a plan view showing a step that follows the step of FIG. 5. FIG. 8 shows a cross section taken along line 8-8 of FIG. 7. In this step, a plurality of grooves 104 that open in the first surface 101a of the pre-array wafer 101 are formed in the pre-array wafer 101 so as to define the respective areas of the plurality of pre-semiconductor-chip portions 30P. At the positions of the boundaries between every two adjacent pre-semiconductor-chip portions 30P, the grooves 104 are formed to pass through the boundaries between every two adjacent pre-semiconductor-chip portions 30P. The grooves 104 are formed such that their bottoms do not reach the second surface 101b of the pre-array wafer 101. The grooves 104 are each 10 to 150 μm wide, for example. The grooves 104 are each 30 to 150 μm deep, for example. For example, the grooves 104 may be formed by using a dicing saw, or by performing etching such as reactive ion etching. A pre-polishing array main body 105 is thus formed by the pre-array wafer 101 with the plurality of grooves 104 formed therein.

Figure 9:
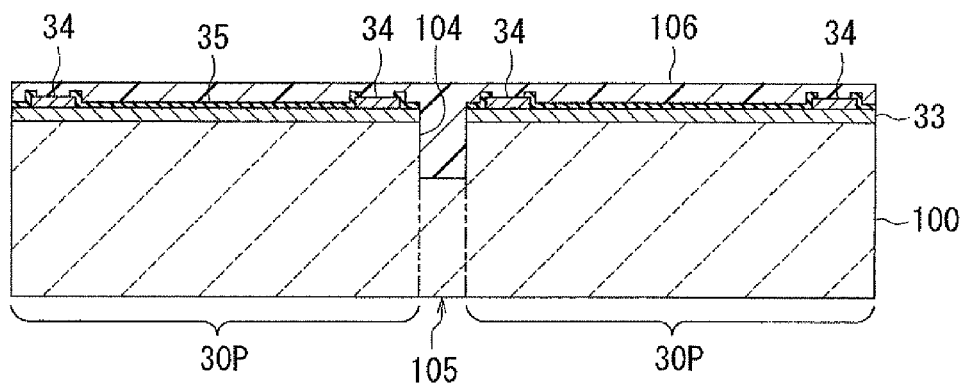
FIG. 9 is a cross-sectional view showing a step that follows the step of FIG. 8.

FIG. 9 shows a step that follows the step of FIG. 8. In this step, an insulating layer 106 is formed to fill the plurality of grooves 104 of the pre-polishing array main body 105 and to cover the plurality of electrode pads 34. The insulating layer 106 is to become a part of the insulating portion 31 later. The insulating layer 106 may be formed of a resin such as an epoxy resin or a polyimide resin. The insulating layer 106 may also be formed of a photosensitive material such as a polyimide resin containing a sensitizer.

Figure 10:
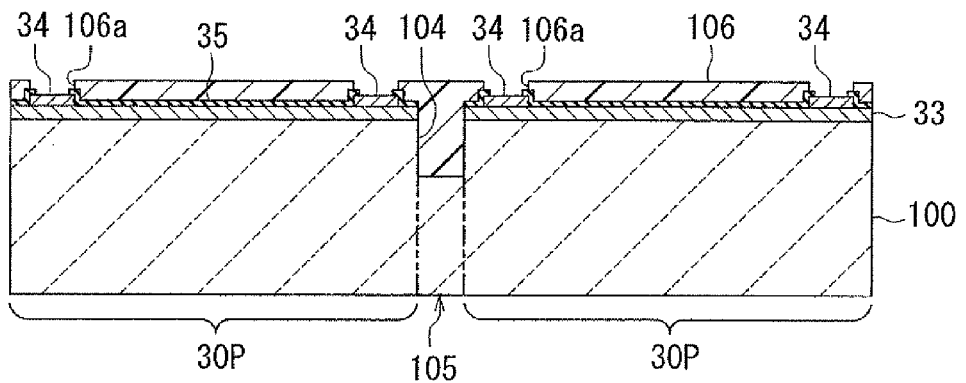
FIG. 10 is a cross-sectional view showing a step that follows the step of FIG. 9.

FIG. 10 shows a step that follows the step of FIG. 9. In this step, a plurality of openings 106a for exposing the plurality of electrode pads 34 are formed in the insulating layer 106. If the insulating layer 106 is formed of a photosensitive material, the openings 106a of the insulating layer 106 may be formed by photolithography. If the insulating layer 106 is formed of a non-photosensitive material, the openings 106a of the insulating layer 106 may be formed by selectively etching the insulating layer 106.

The insulating layer 106 may include a first layer that fills the plurality of grooves 104, and a second layer that covers the first layer and the plurality of electrode pads 34. In this case, the openings 106a are formed in the second layer. Both of the first layer and the second layer may be formed of a resin such as an epoxy resin or a polyimide resin. The second layer may be formed of a photosensitive material such as a polyimide resin containing a sensitizer. If the second layer is formed of a photosensitive material, the openings 106a may be formed in the second layer by photolithography. If the second layer is formed of a non-photosensitive material, the openings 106a may be formed in the second layer by selectively etching the second layer. The first layer may be flattened at the top by ashing or chemical mechanical polishing (CMP), for example, before forming the second layer on the first layer.

Next, performed is the step of forming a plurality of preliminary electrodes 32P in the normally functioning pre-semiconductor-chip portions 30P while not forming the preliminary electrodes 32P in the malfunctioning pre-semiconductor-chip portions 30P. The plurality of preliminary electrodes 32P are intended to become the plurality of electrodes 32 later. This step includes the steps of: forming a photoresist layer that is intended to be used for forming the plurality of preliminary electrodes 32P in individual pre-semiconductor-chip portions 30P and includes a plurality of areas corresponding to all the pre-semiconductor-chip portions 30P; forming a frame by patterning the photoresist layer by photolithography, the frame having a plurality of openings that are intended to accommodate the plurality of preliminary electrodes 32P later, the openings being formed in areas of the photoresist layer that correspond to the normally functioning pre-semiconductor-chip portions 30P; and forming the plurality of preliminary electrodes 32P so that they are accommodated in the plurality of openings of the frame.

Figure 11:
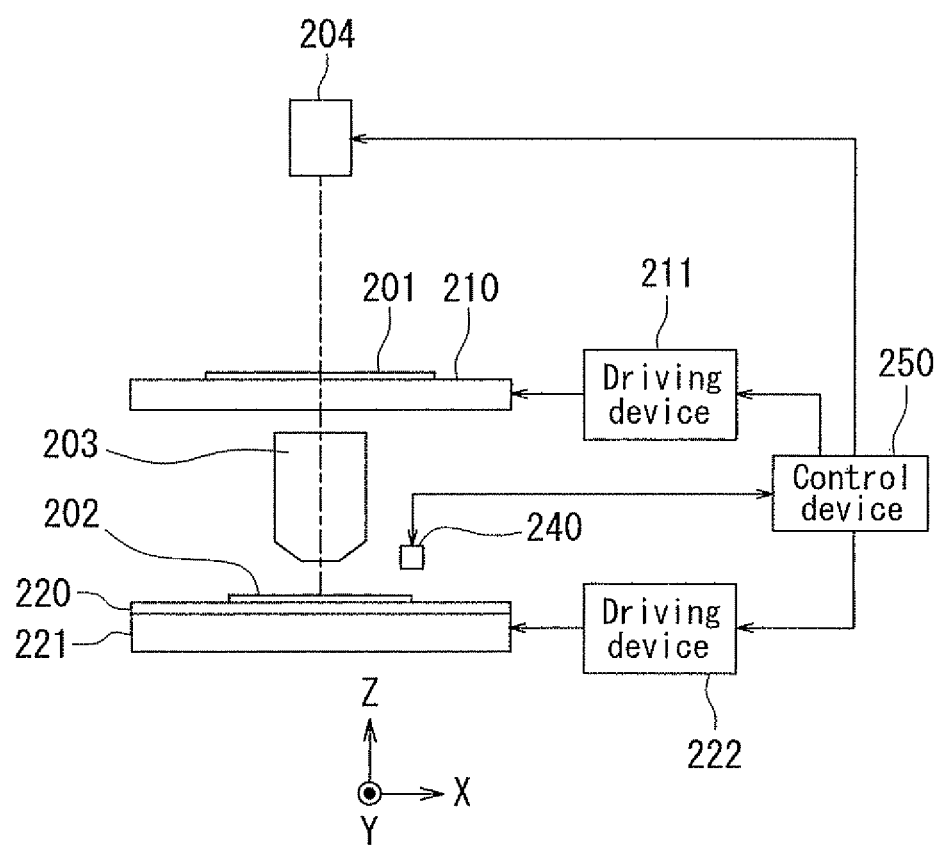
FIG. 11 is an explanatory diagram showing an example of the configuration of an exposure apparatus for use in the method of manufacturing the layered chip package according to the first embodiment of the invention.

Reference is now made to FIG. 11 to describe an example of the configuration of an exposure apparatus for use in the step of forming the frame. The exposure apparatus shown in FIG. 11 is a stepping projection exposure apparatus, or a so-called stepper. The exposure apparatus includes: a mask stage 210 for retaining a mask 201; a driving device 211 for driving the mask stage 210 to move or replace the mask 201; a wafer stage 220 for retaining a wafer 202; a moving mechanism 221 for moving the wafer stage 220; a driving device 222 for driving the moving mechanism 221; a reduction projection optical system 203; an illumination device 204; a detection device 240 for detecting the location of the wafer 202; and a control device 250 for controlling the illumination device 204, the driving devices 211 and 222 and the detection device 240.

The mask stage 210 is disposed above the wafer stage 220. The reduction projection optical system 203 is disposed between the mask stage 210 and the wafer stage 220. The illumination device 204 is disposed above the mask stage 210 and applies light for exposure to the mask 201.

The moving mechanism 221 is capable of moving the wafer stage 220 in X, Y and Z directions shown in FIG. 11 and capable of changing the angle of inclination of the wafer stage 220 with respect to the X-Y plane. The X direction and the Y direction are orthogonal to each other and are both orthogonal to the direction of the optical axis of the reduction projection optical system 203. The Z direction is parallel to the direction of the optical axis of the reduction projection optical system 203. The detection device 240 detects the location of the surface of the wafer 202 and the angle of inclination of the surface of the wafer 202 with respect to the X-Y plane.

The control device 250 has a microprocessor unit (MPU), read only memory (ROM) and random access memory (RAM).

To expose the wafer 202 to light using this exposure apparatus, a plurality of pattern projection regions are defined on the surface of the wafer 202. A ray bundle emitted from the illumination device 204 passes through the mask 201 and is applied to one of the pattern projection regions by the reduction projection optical system 203. The mask pattern of the mask 201 is thereby projected onto the one of the pattern projection regions via the reduction projection optical system 203 so as to perform the process of exposing the one of the pattern projection regions. After performing the process of exposing the one of the pattern projection regions based on the mask pattern, the exposure apparatus moves the wafer 202 in the X or Y direction, and performs the same exposure process for a next one of the pattern projection regions.

Figure 12:
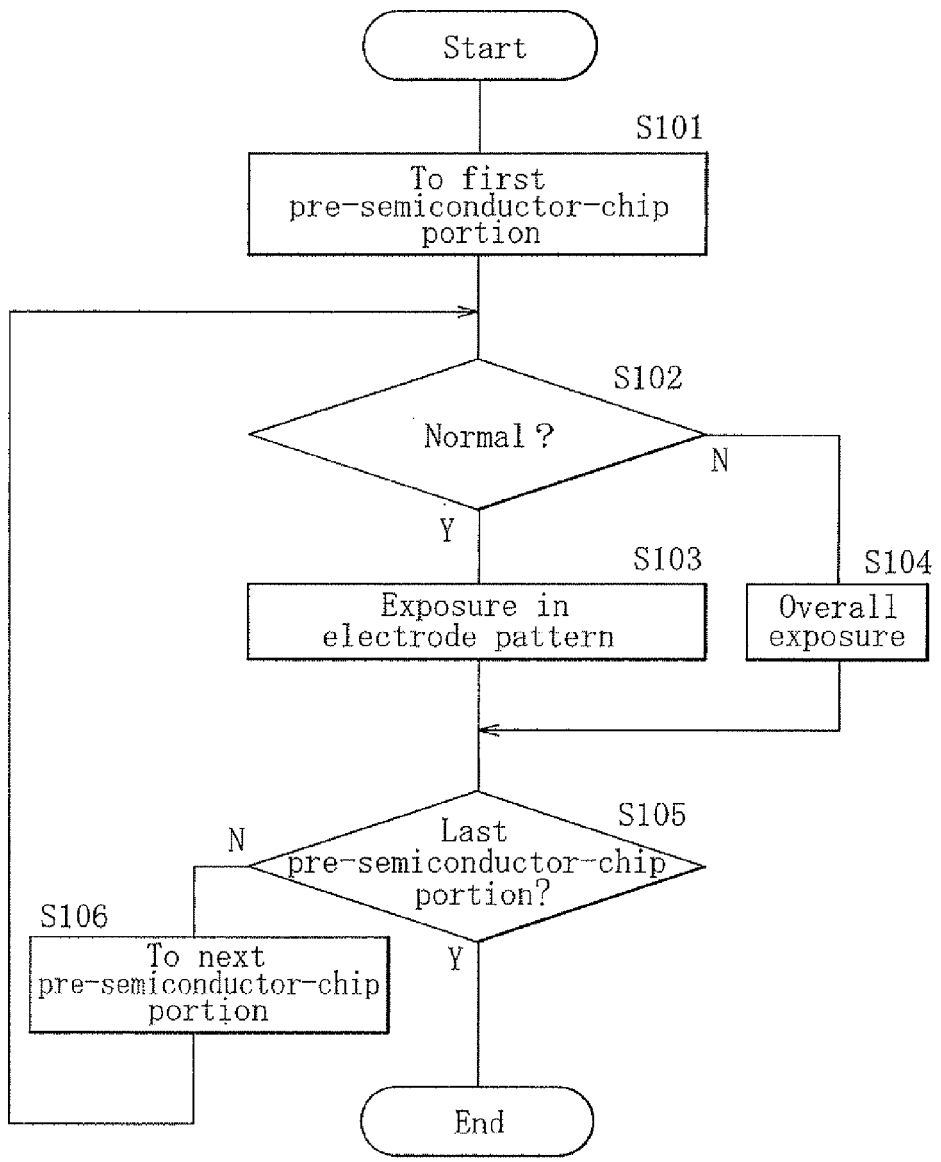
FIG. 12 is a flow chart showing an exposure step for forming a plurality of electrodes in the method of manufacturing the layered chip package according to the first embodiment of the invention.

Next, with reference to the flowchart of FIG. 12, a description will be given of the step of exposing the photoresist layer to light in order to form the frame to be used for forming the plurality of preliminary electrodes 32P. The following description will be given for situations where the photoresist layer is of negative type. The photoresist layer of negative type is soluble in a developing solution for the portions unirradiated with light, and becomes insoluble in the developing solution for the portions irradiated with light. In this exposure step, the photoresist layer is exposed to light so that a latent image corresponding to the plurality of preliminary electrodes 32P is formed in the areas of the photoresist layer that correspond to the normally functioning pre-semiconductor-chip portions 30P while any latent image corresponding to the plurality of preliminary electrodes 32P is not formed in the areas of the photoresist layer that correspond to the malfunctioning pre-semiconductor-chip portions 30P. In the exposure step, first, among the plurality of pattern projection regions corresponding to the plurality of pre-semiconductor-chip portions 30P, a pattern projection region corresponding to a first pre-semiconductor-chip portion 30P is selected to be exposed by the exposure apparatus of FIG. 11 (Step S101). Next, the control device 250 judges whether the pre-semiconductor-chip portion 30P corresponding to the selected pattern projection region is a normally functioning one or not (Step S102). The location information on the normally functioning pre-semiconductor-chip portions 30P and the malfunctioning pre-semiconductor-chip portions 30P in each pre-array wafer 101 obtained by the wafer sort test is input to and held by the control device 250. The control device 250 makes a judgment in Step S102 based on the location information.

If the pre-semiconductor-chip portion 30P is judged as a normally functioning one (Y) in Step S102, the area of the photoresist layer corresponding to the normally functioning pre-semiconductor-chip portion 30P is exposed to light in a pattern corresponding to the plurality of preliminary electrodes 32P (hereinafter referred to as an electrode pattern) by using a mask 201 that has the electrode pattern (Step S103). Specifically, the electrode pattern is such a pattern that the parts of the pattern projection region where to form the openings to accommodate the preliminary electrodes 32P later are not irradiated with light while the other parts of the pattern projection region are irradiated with light. As a result of this exposure, the latent image corresponding to the plurality of preliminary electrodes 32P is formed in the area of the photoresist layer corresponding to the normally functioning pre-semiconductor-chip portion 30P. To be more specific, after this exposure, the area of the photoresist layer corresponding to the normally functioning pre-semiconductor-chip portion 30P remains soluble in the developing solution for the parts where to form the openings to accommodate the preliminary electrodes 32P later, and becomes insoluble in the developing solution for the other parts.

If the pre-semiconductor-chip portion 30P is judged as a malfunctioning one (N) in Step S102, the area of the photoresist layer corresponding to the malfunctioning pre-semiconductor-chip portion 30P is subjected to an overall exposure by using a mask 201 that entirely passes light, or without using any mask 201 (Step S104). As a result, any latent image corresponding to the preliminary electrodes 32P is not formed in the area of the photoresist layer corresponding to the malfunctioning pre-semiconductor-chip portion 30P. To be more specific, the entire area of the photoresist layer corresponding to the malfunctioning pre-semiconductor-chip portion 30P becomes insoluble in the developing solution. If the second-type layer portion 10B includes any electrode or wiring that is other than one configured to electrically connect the defective semiconductor chip 30 to the wires 3a, an exposure is performed in Step S104 so that a latent image corresponding to such an electrode or wiring is formed, instead of the overall exposure. In this case also, any latent image corresponding to the preliminary electrodes 32P is not formed in the area of the photoresist layer corresponding to the malfunctioning pre-semiconductor-chip portion 30P.

After Step S103 or S104 is performed, the control device 250 judges whether the pattern projection region that has undergone the exposure in Step S103 or S104 is the region corresponding to the last pre-semiconductor-chip portion 30P or not (Step S105). If the pattern projection region is judged as corresponding to the last pre-semiconductor-chip portion 30P (Y), the exposure step ends. If the pattern projection region is judged as not corresponding to the last pre-semiconductor-chip portion 30P (N), a pattern projection region corresponding to a next pre-semiconductor-chip portion 30P is selected to be exposed (Step S106) and the process is repeated from Step S102.

Figure 13A:
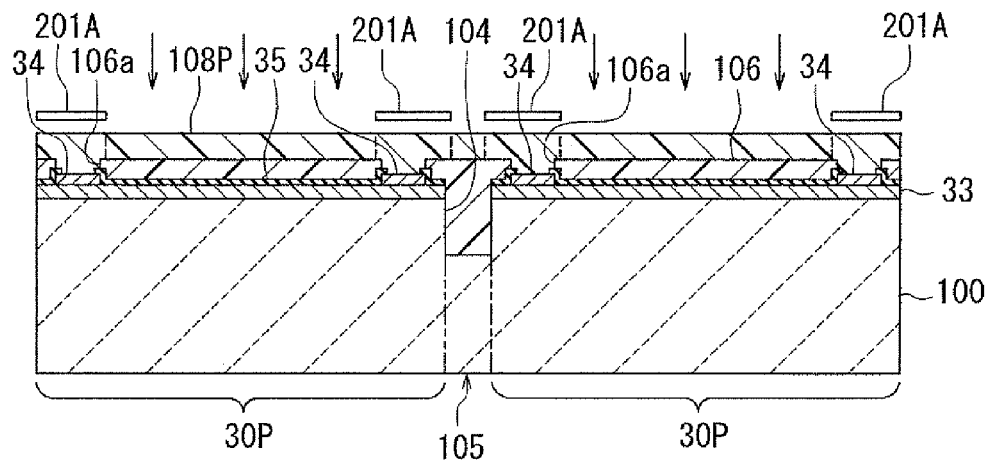
FIG. 13A and FIG. 13B are cross-sectional views showing a step that follows the step of FIG. 10.
Figure 13B:
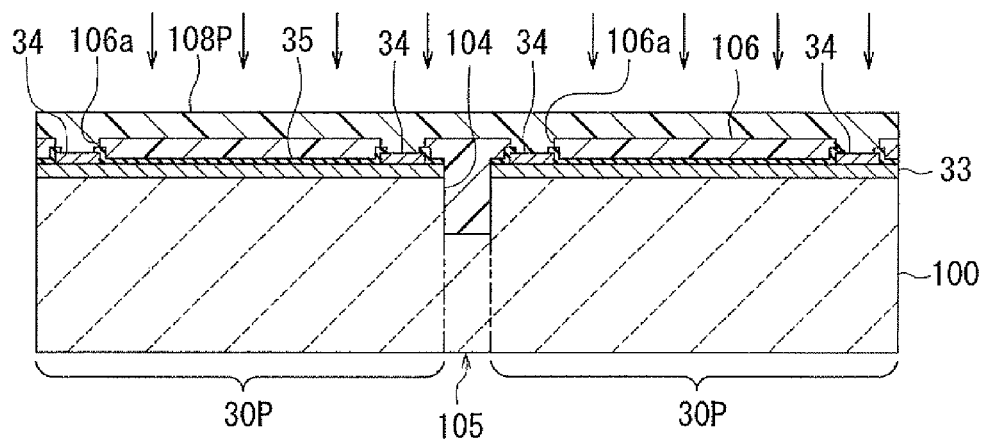

FIG. 13A and FIG. 13B show a step that follows the step of FIG. 10. FIG. 13A shows areas corresponding to the normally functioning pre-semiconductor-chip portions 30P. FIG. 13B shows areas corresponding to the malfunctioning pre-semiconductor-chip portions 30P.

In the step shown in FIG. 13A and FIG. 13B, first, a photoresist layer 108P including a plurality of areas corresponding to all the pre-semiconductor-chip portions 30P is formed. Next, as shown in FIG. 13A, the areas of the photoresist layer 108P that correspond to the normally functioning pre-semiconductor-chip portions 30P are exposed to light in the electrode pattern in Step S103 of FIG. 12 by using a mask 201A that has the electrode pattern. On the other hand, the areas of the photoresist layer 108P that correspond to the malfunctioning pre-semiconductor-chip portions 30P are subjected to an overall exposure in Step S104 of FIG. 12, as shown in FIG. 13B.

Figure 14A:
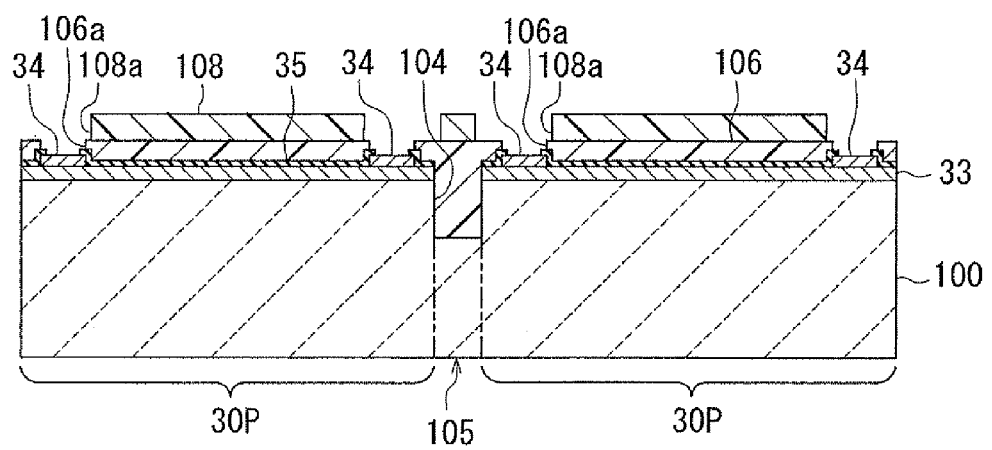
FIG. 14A and FIG. 14B are cross-sectional views showing a step that follows the step of FIG. 13A and FIG. 13B.
Figure 14B:
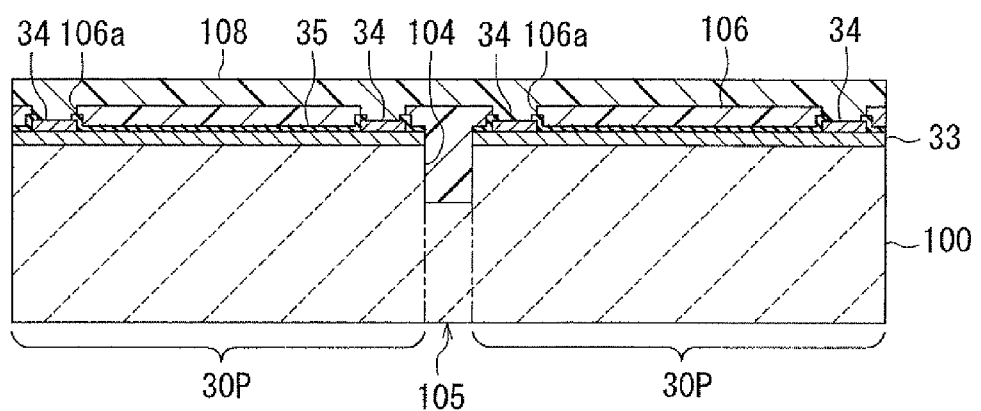

FIG. 14A and FIG. 14B show a step that follows the step of FIG. 13A and FIG. 13B. FIG. 14A shows areas corresponding to the normally functioning pre-semiconductor-chip portions 30P. FIG. 14B shows areas corresponding to the malfunctioning pre-semiconductor-chip portions 30P. In this step, the photoresist layer 108P is developed with a developing solution. A frame 108 is thereby formed. In the areas corresponding to the normally functioning pre-semiconductor-chip portions 30P, as shown in FIG. 14A, a plurality of openings 108a to accommodate the plurality of preliminary electrodes 32P later are formed in the frame 108. On the other hand, in the areas corresponding to the malfunctioning pre-semiconductor-chip portions 30P, no openings 108a are formed in the frame 108 as shown in FIG. 14B.

Figure 15A:
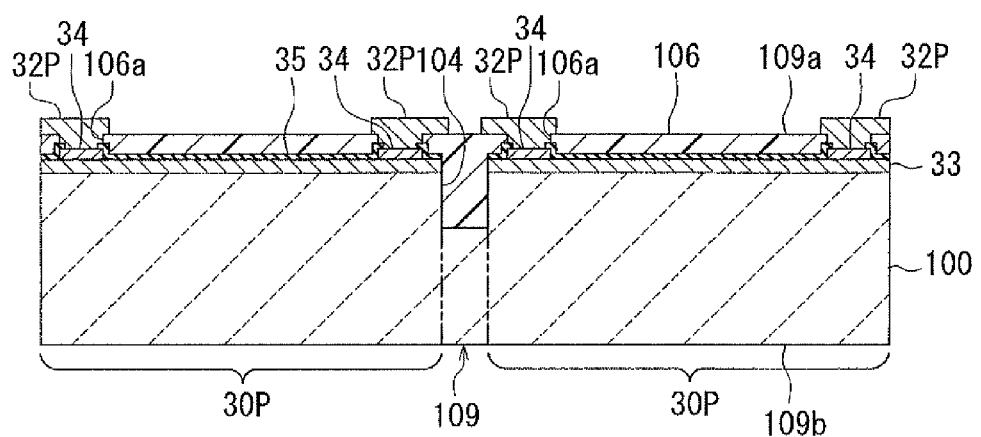
FIG. 15A and FIG. 15B are cross-sectional views showing a step that follows the step of FIG. 14A and FIG. 14B.
Figure 15B:
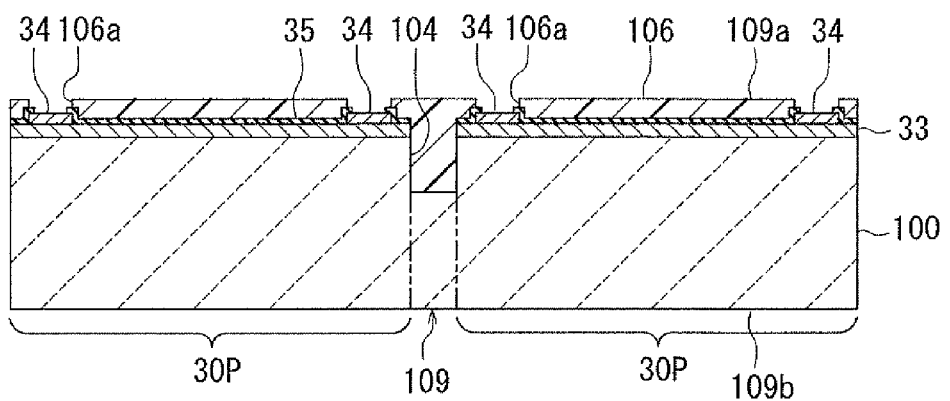
Figure 16:
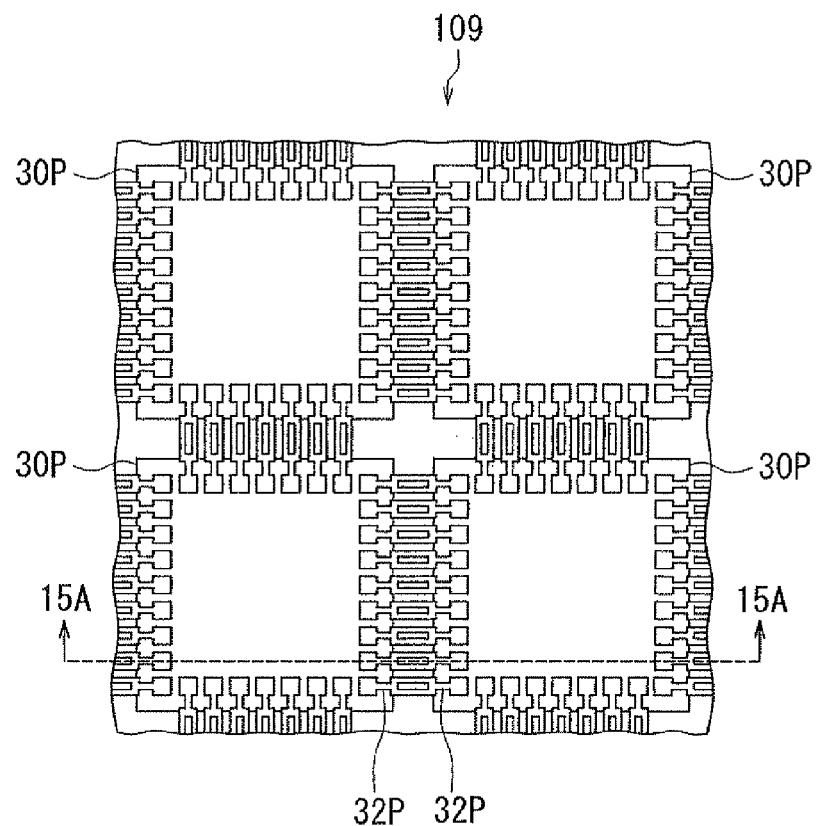
FIG. 16 is a plan view showing the step of FIG. 15A.

FIG. 15A, FIG. 15B and FIG. 16 show a step that follows the step of FIG. 14A and FIG. 14B. FIG. 15A and FIG. 16 show areas corresponding to the normally functioning pre-semiconductor-chip portions 30P. FIG. 15B shows areas corresponding to the malfunctioning pre-semiconductor-chip portions 30P. FIG. 15A shows a cross section taken along line 15A-15A of FIG. 16. In this step, the plurality of preliminary electrodes 32P are formed in the plurality of openings 108a of the frame 108 by, for example, plating, in the areas corresponding to the normally functioning pre-semiconductor-chip portions 30P as shown in FIG. 15A. The plurality of preliminary electrodes 32P are formed such that a part of each of the preliminary electrodes 32P lies on the insulating layer 106. The preliminary electrodes 32P are connected to the electrode pads 34 through the openings 106a. In the areas corresponding to the malfunctioning pre-semiconductor-chip portions 30P, as shown in FIG. 15B, the plurality of preliminary electrodes 32 are not formed since the plurality of openings 108a are not formed in the frame 108. A pre-polishing array 109 shown in FIG. 15A, FIG. 15B and FIG. 16 is thereby fabricated. The pre-polishing array 109 has a first surface 109a corresponding to the first surface 101a of the pre-array wafer 101, and a second surface 109b corresponding to the second surface 101b of the pre-array wafer 101.

The preliminary electrodes 32P are formed of a conductive material such as Cu. In the case of forming the preliminary electrodes 32P by plating, a seed layer for plating is formed on the insulating layer 106 before forming the photoresist layer. Next, the photoresist layer is formed on the seed layer. The photoresist layer is then patterned by photolithography to thereby form the frame 108. Next, plating layers that are intended to constitute respective portions of the preliminary electrodes 32P are formed by plating on the seed layer in the openings 108a of the frame 108. The plating layers are 5 to 15 μm thick, for example. Next, the frame 108 is removed, and portions of the seed layer other than those lying under the plating layers are also removed by etching. The preliminary electrodes 32P are thus formed by the plating layers and the remaining portions of the seed layer under the plating layers.

In the example shown in FIG. 16, respective plurality of preliminary electrodes 32P of two adjacent pre-chip portions 30P are connected to each other at the position between the two pre-chip portions 30P. To be more specific, two sets of preliminary electrodes 32P that are arranged along the two opposing sides of two adjacent pre-chip portions 30P are connected to each other on a one-on-one basis. The shape of the preliminary electrodes 32P will be detailed later.

Figure 17:
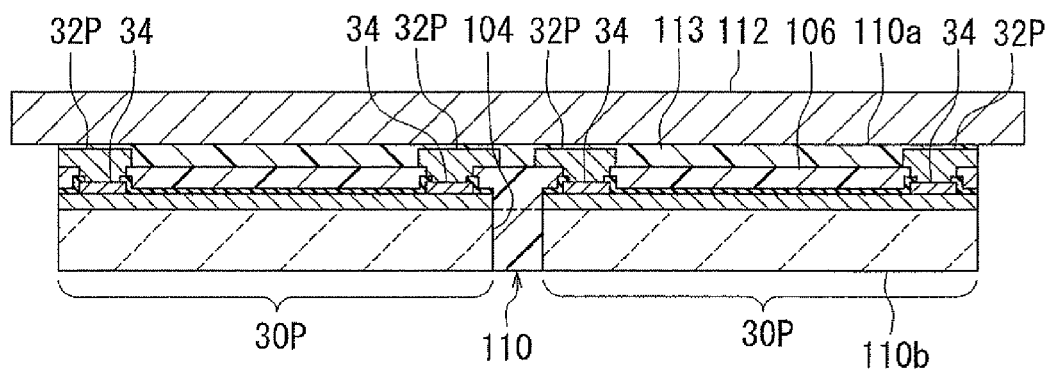
FIG. 17 is a cross-sectional view showing a step that follows the step of FIG. 15A to FIG. 16.

FIG. 17 shows a step that follows the step shown in FIG. 15A to FIG. 16. In this step, using an insulating adhesive, the pre-polishing array 109 is initially bonded to a plate-shaped jig 112 shown in FIG. 17 with the first surface 109a of the pre-polishing array 109 arranged to face a surface of the jig 112. Hereinafter, the pre-polishing array 109 bonded to the jig 112 will be referred to as a first pre-polishing array 109. The reference numeral 113 in FIG. 17 indicates an insulating layer 113 formed by the adhesive.

Next, the second surface 109b of the first pre-polishing array 109 is polished. This polishing is performed until the plurality of grooves 104 are exposed. By polishing the second surface 109b of the first pre-polishing array 109, the first pre-polishing array 109 is thinned. This forms a chip array 110 in the state of being bonded to the jig 112. The chip array 110 has a thickness of 30 to 100 μm, for example. Hereinafter, the chip array 110 bonded to the jig 112 will be referred to as a first chip array 110. The first chip array 110 has a first surface 110a corresponding to the first surface 109a of the first pre-polishing array 109, and a second surface 110b opposite to the first surface 110a. The second surface 110b is the polished surface. By polishing the second surface 109b of the first pre-polishing array 109 until the plurality of grooves 104 are exposed, the plurality of pre-semiconductor-chip portions 30P are separated from each other.

Figure 18:
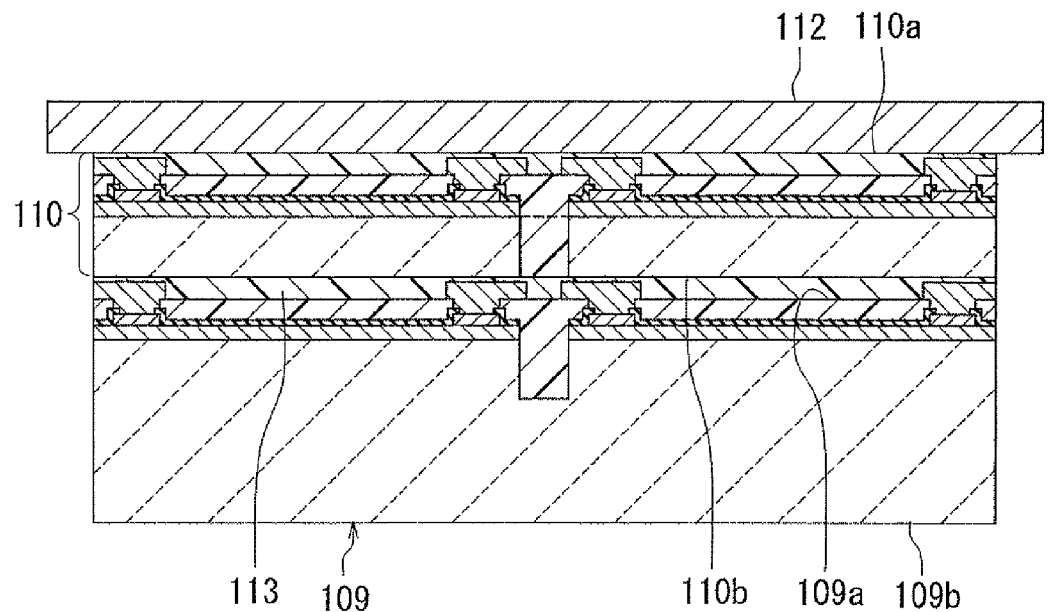
FIG. 18 is a cross-sectional view showing a step that follows the step of FIG. 17.

FIG. 18 shows a step that follows the step of FIG. 17. In this step, using an insulating adhesive, a pre-polishing array 109 is initially bonded to the first chip array 110 bonded to the jig 112. The pre-polishing array 109 is bonded to the first chip array 110 with the first surface 109a arranged to face the polished surface, i.e., the second surface 110b, of the first chip array 110. Hereinafter, the pre-polishing array 109 to be bonded to the first chip array 110 will be referred to as a second pre-polishing array 109. The insulating layer 113 formed by the adhesive between the first chip array 110 and the second pre-polishing array 109 covers the plurality of preliminary electrodes 32P of the second pre-polishing array 109, and is to become a part of the insulating layer 31 later.

Next, although not shown, the second surface 109b of the second pre-polishing array 109 is polished. This polishing is performed until the plurality of grooves 104 are exposed. By polishing the second surface 109b of the second pre-polishing array 109, the second pre-polishing array 109 is thinned. This forms a second chip array 110 in the state of being bonded to the first chip array 110. The second chip array 110 has a thickness of, for example, 30 to 100 μm, as does the first chip array 110.

Figure 19:
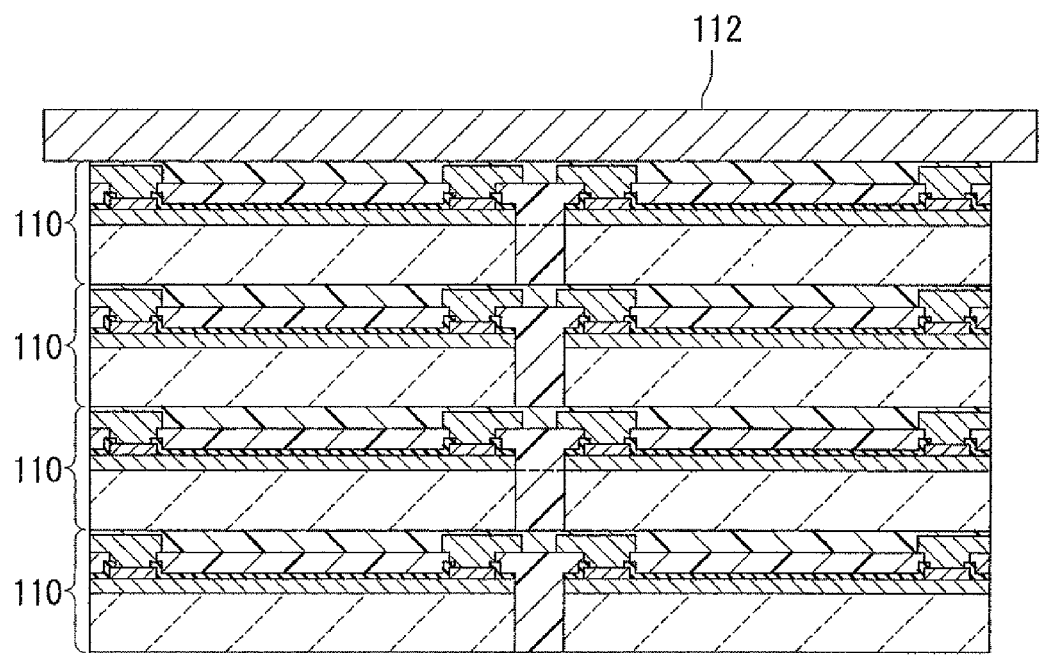
FIG. 19 is a cross-sectional view showing a step that follows the step of FIG. 18.

The same step as shown in FIG. 18 may subsequently be repeated to form three or more chip arrays 110 into a stack. FIG. 19 shows a case where four chip arrays 110 are formed into a stack.

Figure 20:
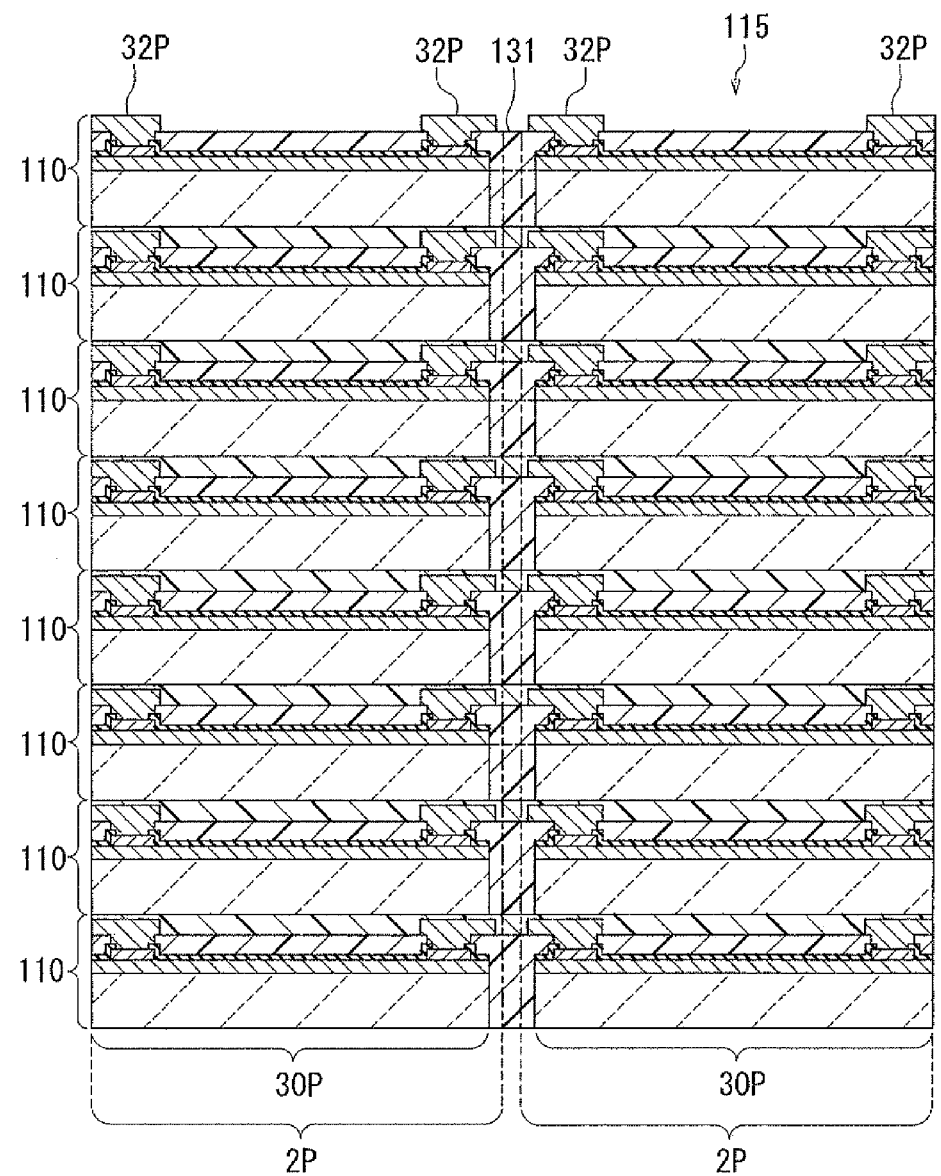
FIG. 20 is a cross-sectional view showing a step that follows the step of FIG. 19.

FIG. 20 shows a step that follows the step of FIG. 19. After the same step as shown in FIG. 18 is repeated to form a predetermined number of chip arrays 110 into a stack, the stack of the predetermined number of chip arrays 110 is released from the jig 112. FIG. 20 shows an example where a stack of eight chip arrays 110 is formed.

Figure 21:
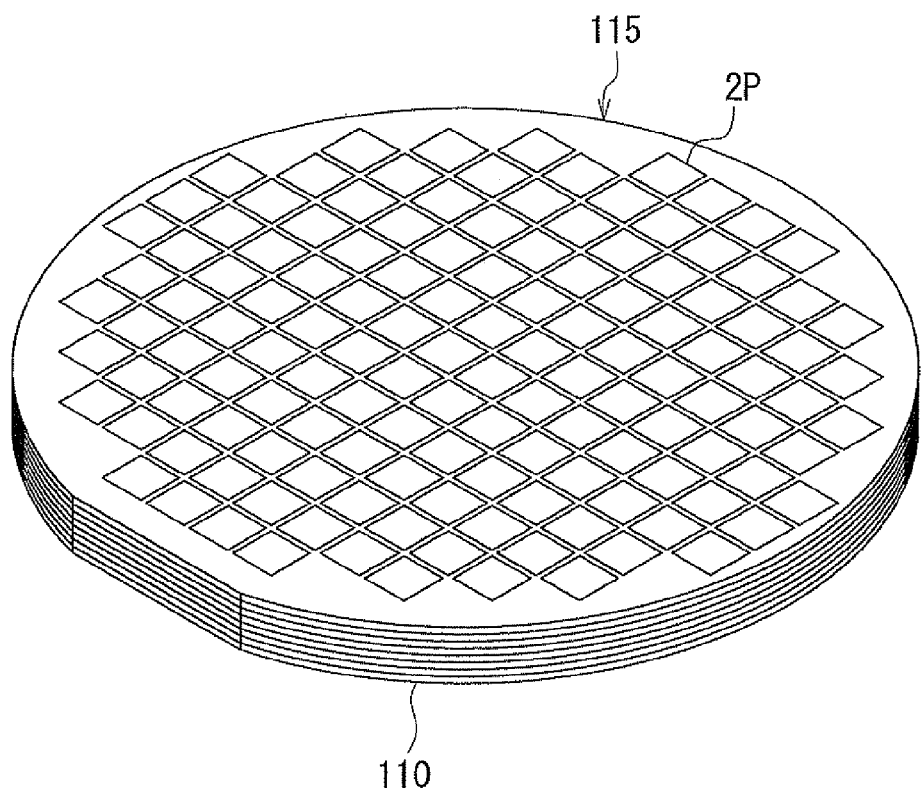
FIG. 21 is a perspective view showing an initial substructure fabricated in the step of FIG. 20.

Next, as shown in FIG. 20, the insulating layer 113 is removed from the uppermost chip array 110 of the stack. This exposes the plurality of preliminary electrodes 32P of the uppermost chip array 110. The exposed preliminary electrodes 32P later become the electrodes 32 that also function as a plurality of terminals 4. A plurality of terminals 4 may also be formed on the bottom surface of the lowermost chip array 110 of the stack. Consequently, there is formed an initial substructure 115 including a stack of a plurality of chip arrays 110. FIG. 21 is a perspective view of the initial substructure 115.

Each chip array 110 includes an array of a plurality of pre-semiconductor-chip portions 30P, and an insulating layer 131 disposed between two adjacent pre-semiconductor-chip portions 30P. The insulating layer 131 is to become a part of the insulating portion 6 later. The insulating layer 131 is formed of a resin, for example. The chip arrays 110 are to be cut later at the positions of the boundaries between every adjacent pre-semiconductor-chip portions 30P. This makes the pre-semiconductor-chip portions 30P into individual semiconductor chips 30. The insulating layer 131 of the uppermost chip array 110 of the initial substructure 115 is formed by the insulating layer 106. The insulating layers 131 of the other chip arrays 110 are formed by the insulating layers 106 and 113. The initial substructure 115 includes an array of a plurality of pre-separation main bodies 2P. The pre-separation main bodies 2P are to be separated from each other later into individual main bodies 2. In the example shown in FIG. 20, each pre-separation main body 2P includes a stack of eight pre-semiconductor-chip portions 30P.

Figure 22:
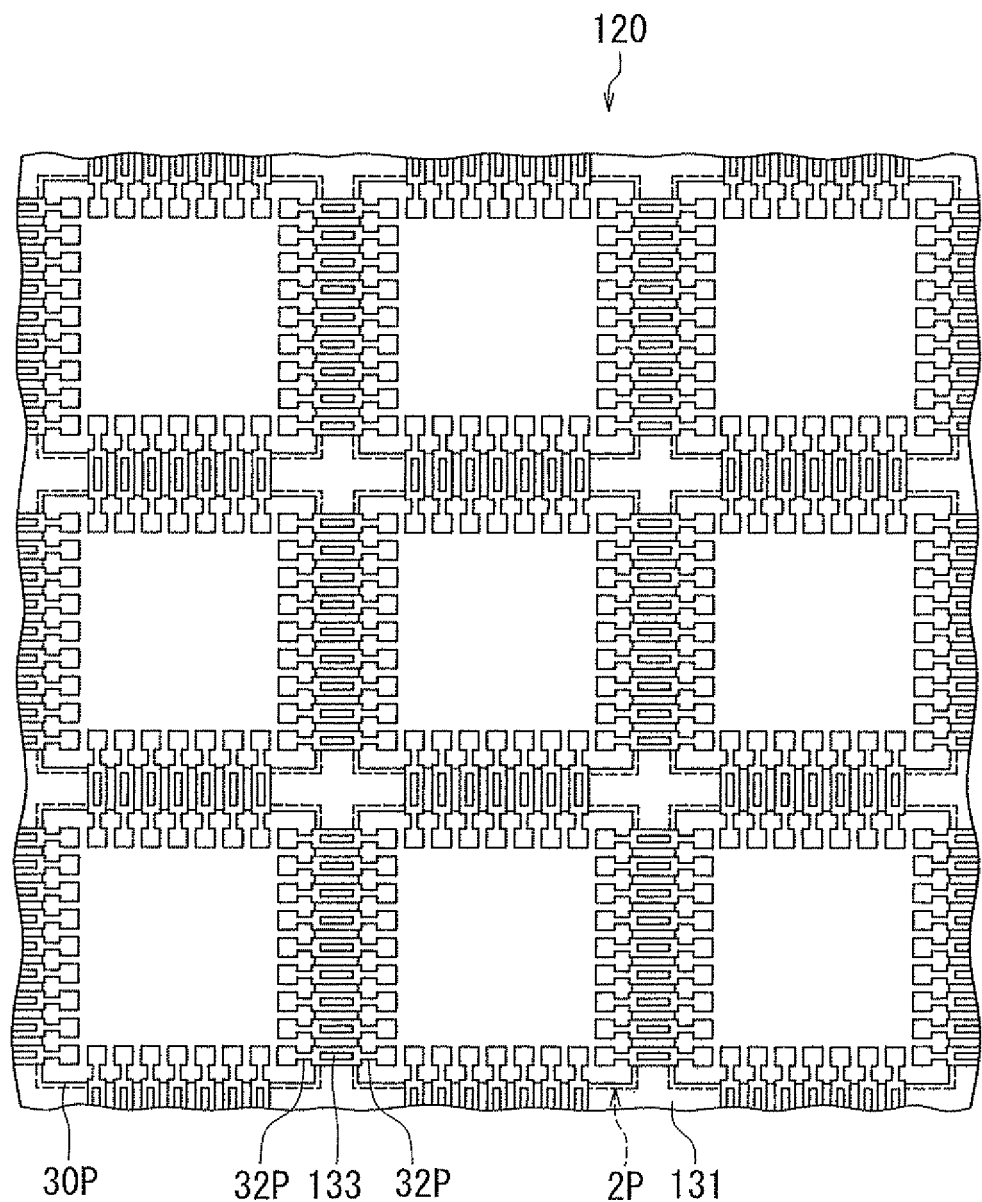
FIG. 22 is a plan view showing a part of a substructure fabricated in a step that follows the step of FIG. 20.
Figure 23:
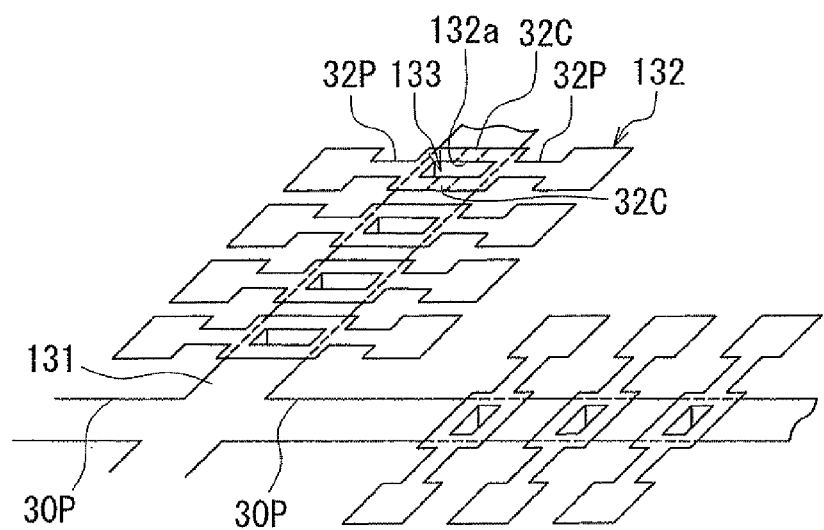
FIG. 23 is a perspective view of a part of the substructure shown in FIG. 22.
Figure 24:
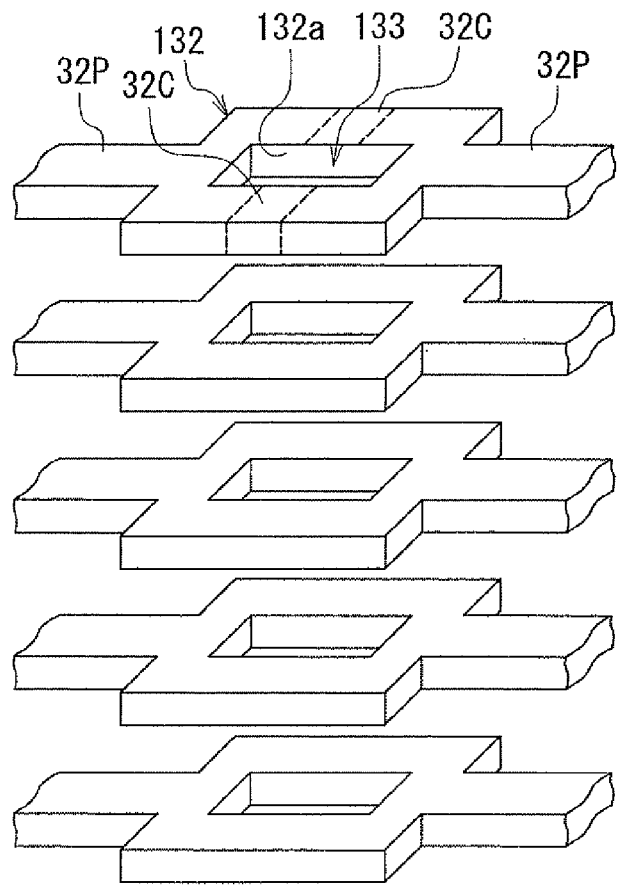
FIG. 24 is a perspective view showing a plurality of preliminary electrodes in the substructure shown in FIG. 22.

Now, with reference to FIG. 22 to FIG. 24, a description will be given of the step of forming a substructure using the initial substructure 115. In this step, a plurality of holes 133 for accommodating a plurality of preliminary wires are formed in the initial substructure 115 at the positions between two adjacent pre-separation main bodies 2P. The initial substructure 115 is thereby made into a substructure 120. FIG. 22 is a plan view showing a part of the substructure 120. FIG. 23 is a perspective view of a part of the substructure 120. FIG. 24 is a perspective view showing a plurality of preliminary electrodes 32P in the substructure 120.

Referring to FIG. 23 and FIG. 24, the shape of the preliminary electrodes 32P will be described in detail. As shown in FIG. 23, two sets of preliminary electrodes 32P that are arranged along the two opposing sides of two adjacent pre-chip portions 30P are connected to each other on a one-on-one basis. The preliminary electrodes 32P each have a two-pronged end that lies outside the outer periphery of the pre-chip portion 30P. The two-pronged ends of each pair of preliminary electrodes 32P are connected to each other by two connecting portions 32C. A pair of preliminary electrodes 32P and the two connecting portions 32C are different sections of a single conductor layer 132. In FIG. 23 and FIG. 24, the boundary positions between the preliminary electrodes 32P and the connecting portions 32C are shown by broken lines. The conductor layer 132 has an opening 132a surrounded by the pair of preliminary electrodes 32P and the two connecting portions 32C. As shown in FIG. 24, each single hole 133 is formed to pierce through the substructure 120, passing through the openings 132a of a plurality of conductor layers 132 that are arranged in the direction in which the plurality of chip arrays 110 are stacked. The preliminary electrodes 32P are exposed in the wall faces of the hole 133.

The plurality of holes 133 are formed in the insulating layers 131 of the plurality of chip arrays 110. The holes 133 can be formed by, for example, laser processing or reactive ion etching. If the insulating layers 131 are formed of resin, the holes 133 can be formed easily in a short time by laser processing or reactive ion etching.

Figure 25:
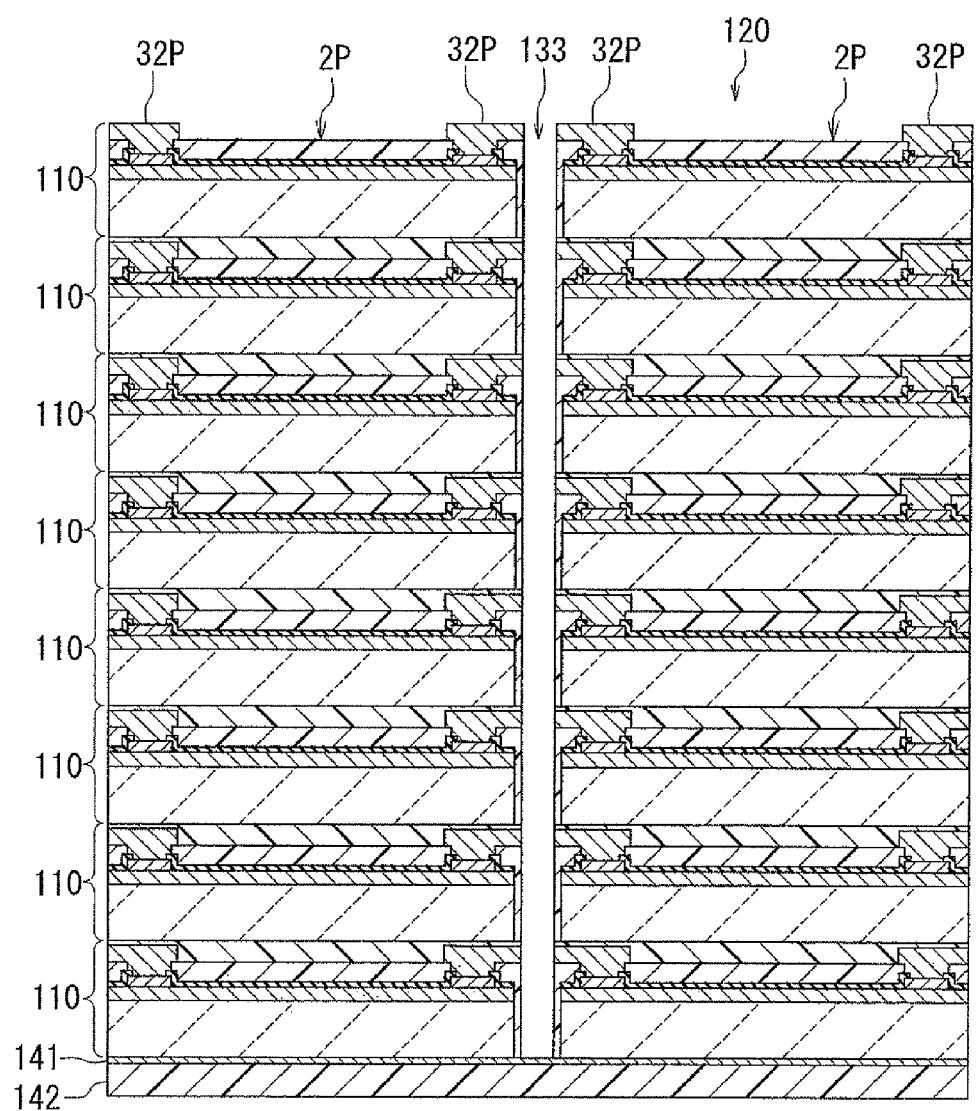
FIG. 25 is a cross-sectional view showing a step that follows the step of FIG. 22.

Next, with reference to FIG. 25 to FIG. 28, a description will be given of the step of forming the preliminary wires in the plurality of holes 133 of the substructure 120 by plating. FIG. 25 is a cross-sectional view showing a step that follows the step of FIG. 22. In this step, first, a seed layer 141 for plating is bonded to the bottom surface of the lowermost chip array 110 of the substructure 120 as shown in FIG. 25. The seed layer 141 is formed of a metal such as copper. The seed layer 141 may be a metal film supported by a plate 142 of resin or the like. Alternatively, the seed layer 141 may be a metal plate. In such a case, the plate 142 for supporting the seed layer 141 is unnecessary.

Figure 26:
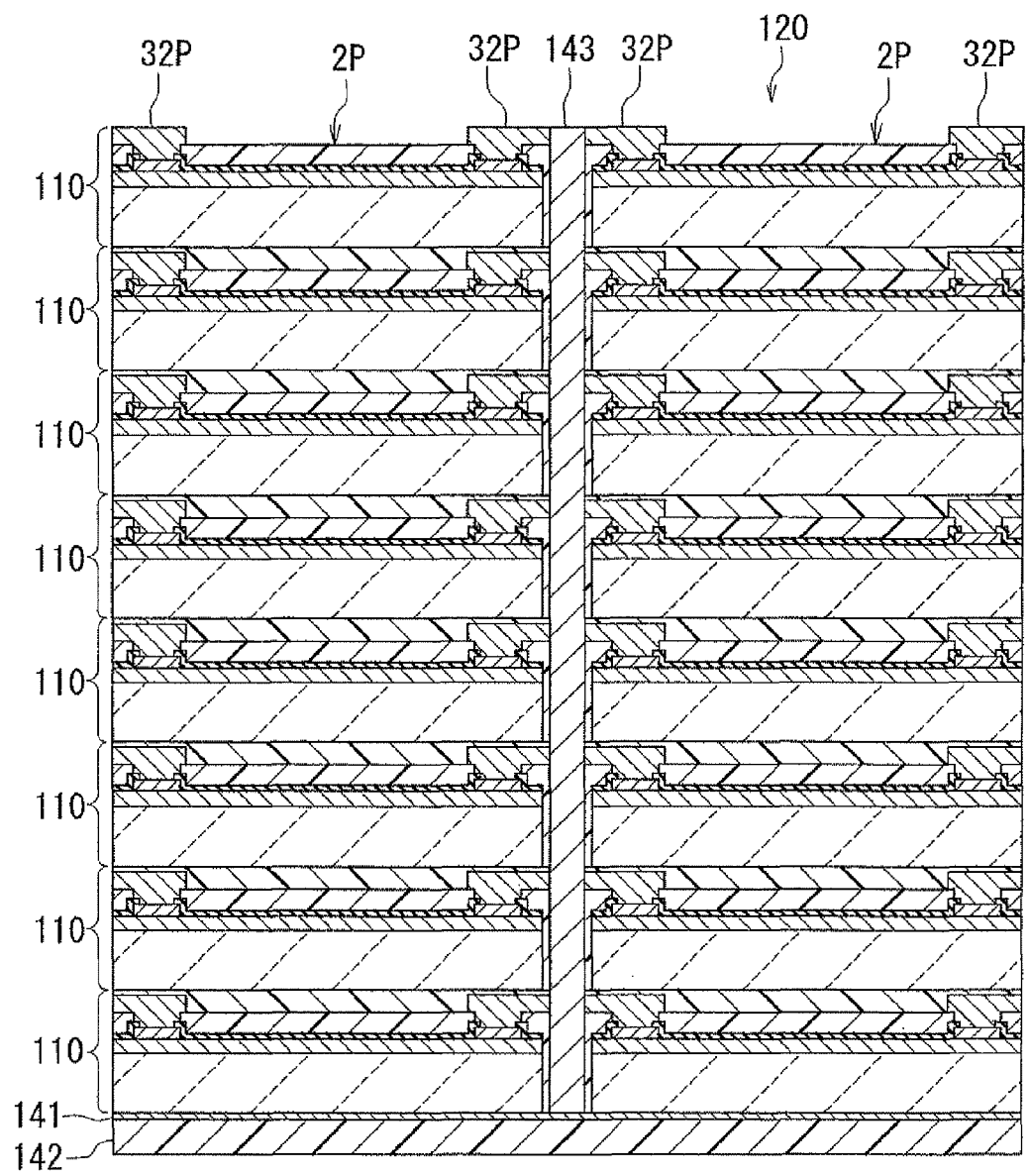
FIG. 26 is a cross-sectional view showing a step that follows the step of FIG. 25.
Figure 27:
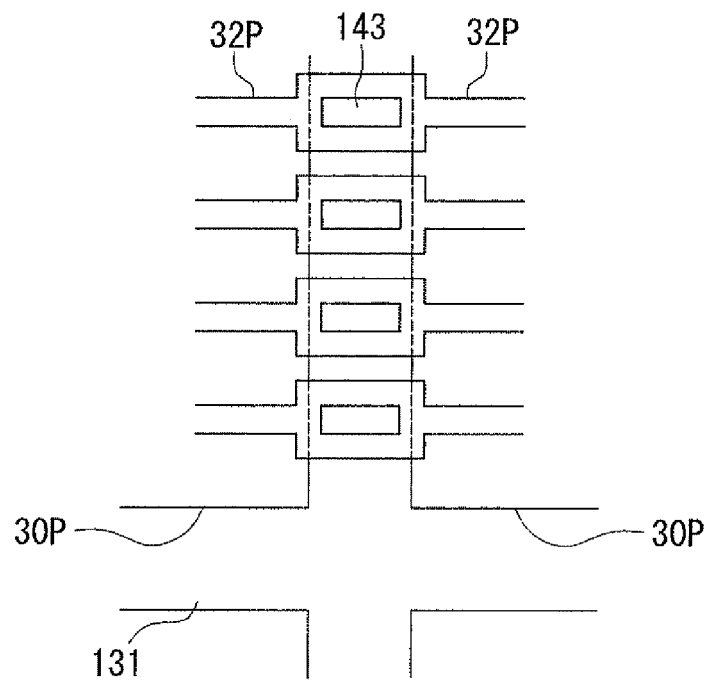
FIG. 27 is a plan view showing the step of FIG. 26.
Figure 28:
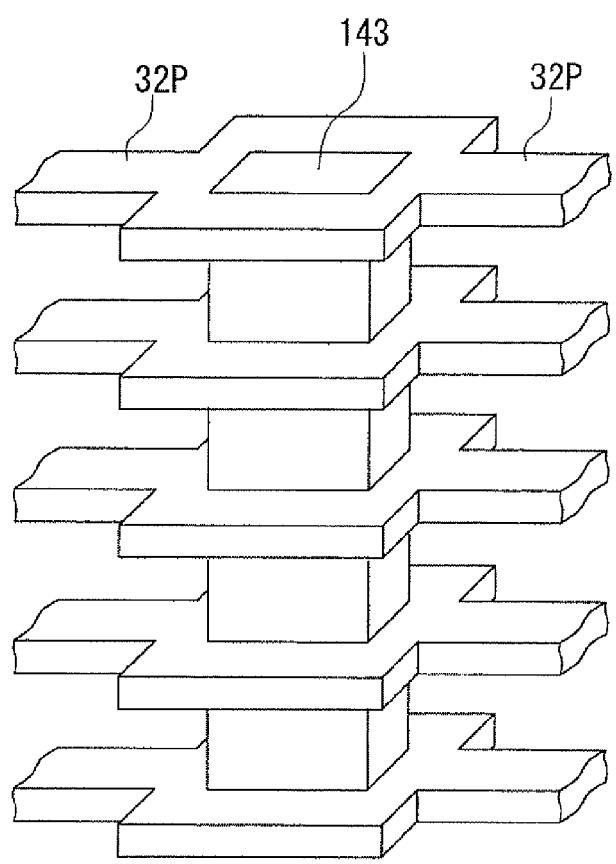
FIG. 28 is a perspective view showing preliminary wires formed in the step of FIG. 26.

FIG. 26 is a cross-sectional view showing a step that follows the step of FIG. 25. In this step, preliminary wires 143 made of a plating film are respectively formed in the plurality of holes 133 of the substructure 120 by electroplating. Here, the seed layer 141 is energized so that the plating films grow from the surface of the seed layer 141 to fill the holes 133. FIG. 27 is a plan view showing a part of the substructure 120 after the formation of the preliminary wires 143. FIG. 28 is a perspective view showing a plurality of preliminary electrodes 32P and a preliminary wire 143 in the substructure 120 shown in FIG. 27. The single preliminary wire 143 is in contact with the plurality of preliminary electrodes 32P that are arranged in the direction in which the plurality of chip arrays 110 are stacked.

Figure 29:
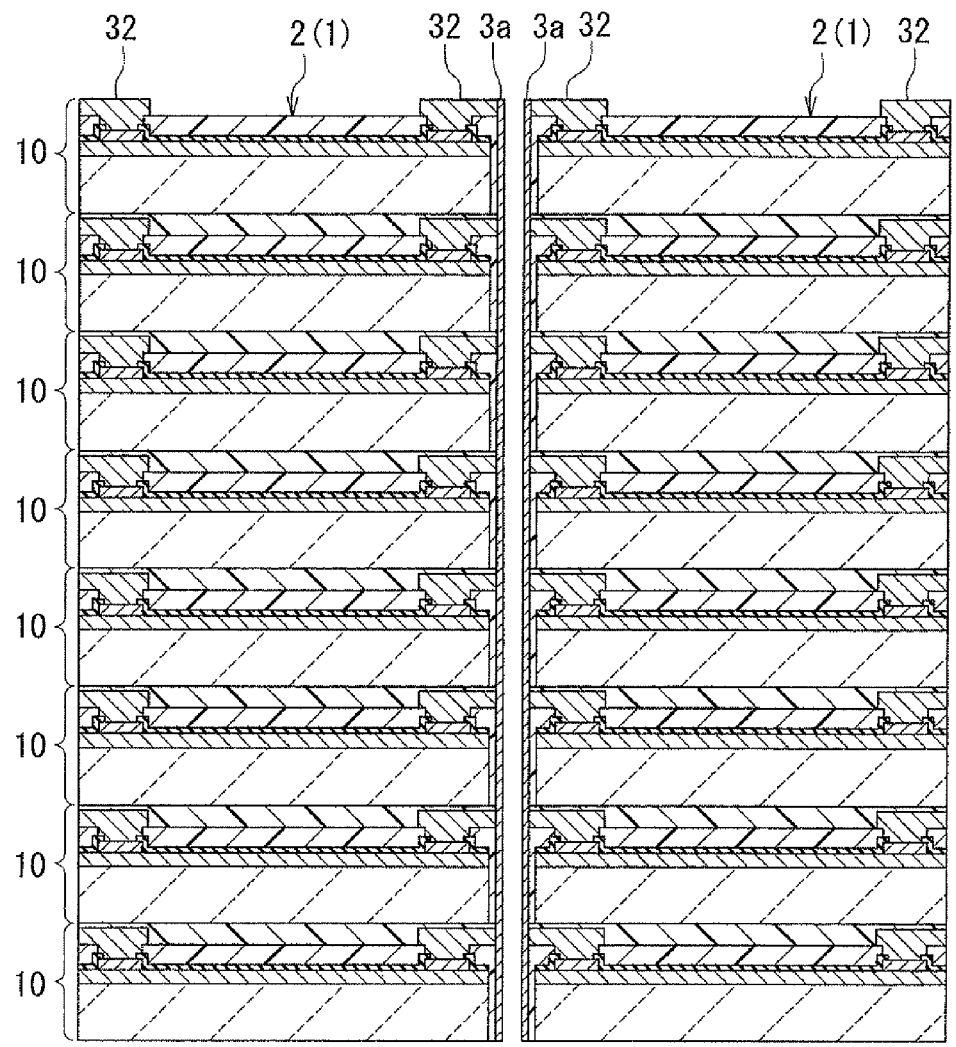
FIG. 29 is a cross-sectional view showing a step that follows the step of FIG. 26.
Figure 30:
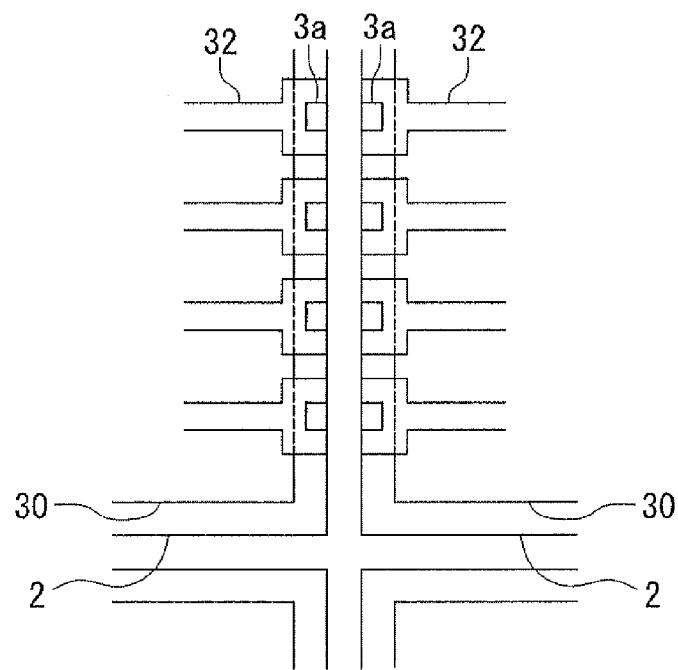
FIG. 30 is a plan view showing the step of FIG. 29.
Figure 31:
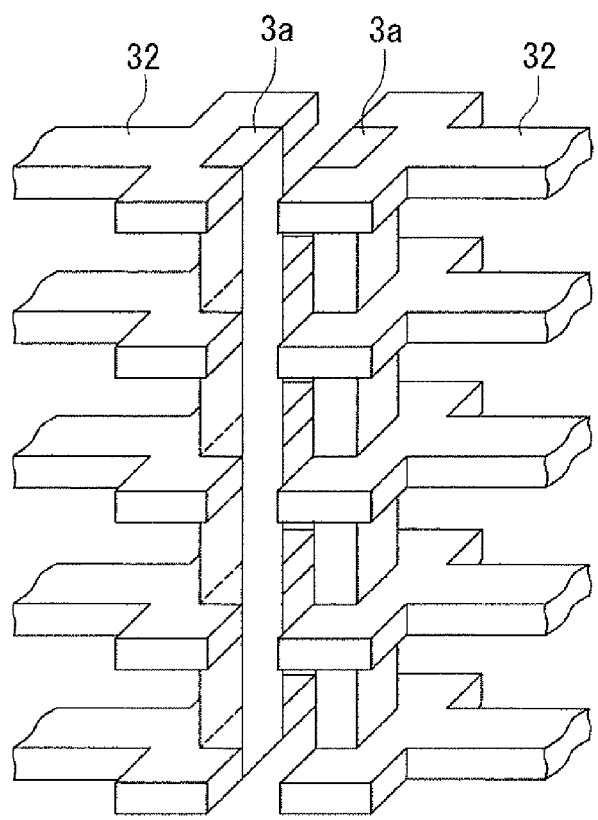
FIG. 31 is a perspective view showing wires formed in the step of FIG. 29.

Next, the step of cutting the substructure 120 will be described with reference to FIG. 29 to FIG. 31. FIG. 29 is a cross-sectional view showing a step that follows the step of FIG. 26. FIG. 30 is a plan view showing the step of FIG. 29. In this step, as shown in FIG. 29 and FIG. 30, the substructure 120 is cut so that the plurality of pre-separation main bodies 2P are separated from each other and the plurality of preliminary wires 143 are split into two sets of a plurality of wires 3a of two separate main bodies 2, whereby a plurality of layered chip packages 1 are formed. When separated from each other, the plurality of pre-separation main bodies 2P become individual main bodies 2. In this step, the respective plurality of preliminary electrodes 32P of two pre-separation main bodies 2P connected to each other are separated from each other into the respective plurality of electrodes 32 of two separate main bodies 2 when the substructure 120 is cut. FIG. 31 shows two wires 3a formed by splitting a single preliminary wire 143 into two. The wires 3a are electrically connected to the plurality of electrodes 32 that are arranged in the direction of stacking of a plurality of layer portions 10 in each main body 2.

A plurality of layered chip packages 1 are thus fabricated through the series of steps that have been described with reference to FIG. 4 to FIG. 31. So far the description has dealt with the case where a plurality of layered chip packages 1 each including eight layer portions 10 are fabricated by using the initial substructure 115 that includes eight chip arrays 110 as shown in FIG. 20. In the present embodiment, however, the number of the chip arrays 110 to be included in the initial substructure 115 can be changed to fabricate a plurality of types of layered chip packages 1 with different numbers of layer portions 10.

Figure 32:
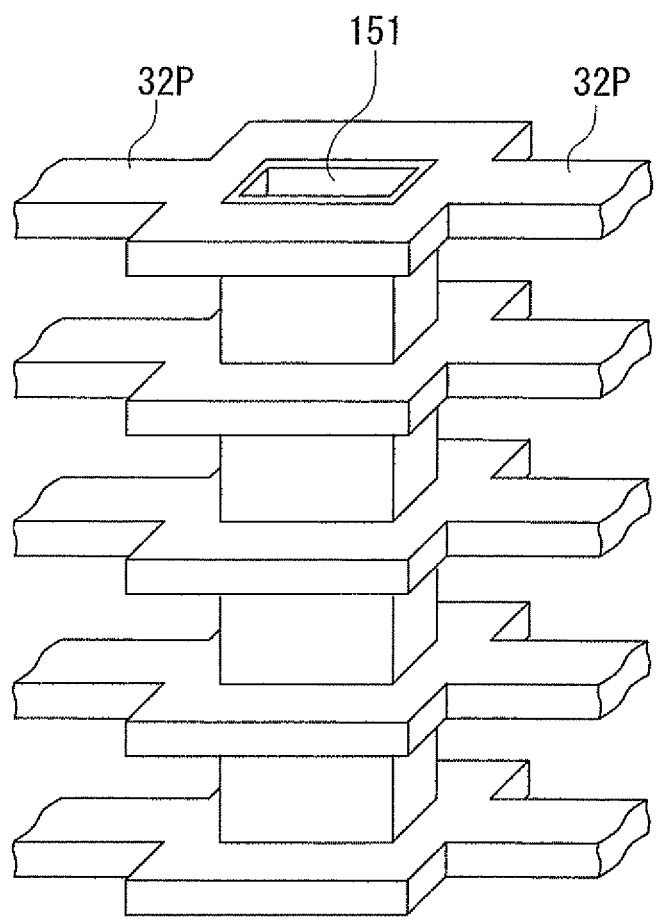
FIG. 32 is a perspective view showing a step of a first modification example of the method of manufacturing the layered chip package according to the first embodiment of the invention.

Now, first and second modification examples of the method of manufacturing the layered chip package 1 according to the present embodiment will be described. Referring to FIG. 32, a description will initially be given of the first modification example. In the first modification example, seed layers 151 each made of a metal film are formed on the wall faces of the plurality of holes 133 of the substructure 120 by electroless plating prior to forming the preliminary wires 143 by electroplating. Subsequently, the preliminary wires 143 each made of a plating film are respectively formed in the plurality of holes 133 of the substructure 120 by electroplating. Here, the seed layers 151 are energized so that the plating films grow from the surfaces of the seed layers 151 to fill the holes 133.

Figure 33:
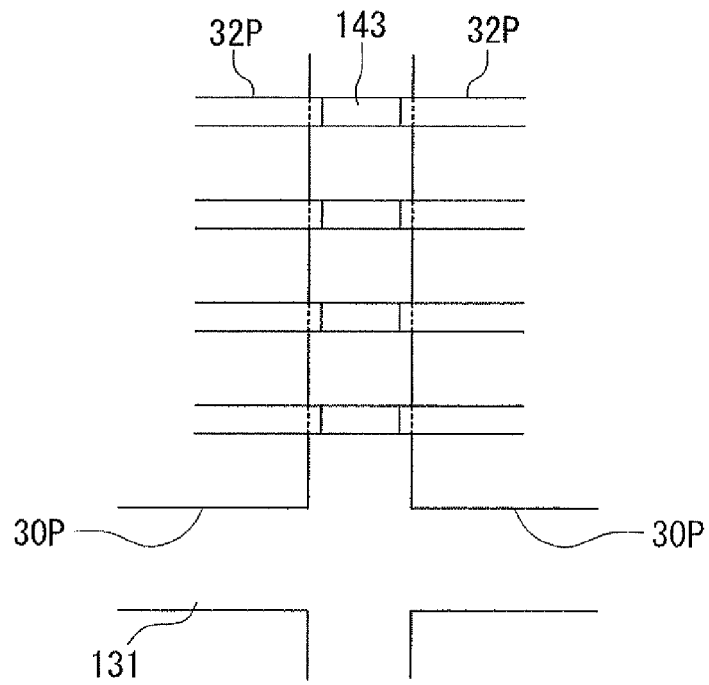
FIG. 33 is a plan view showing a step of a second modification example of the method of manufacturing the layered chip package according to the first embodiment of the invention.
Figure 34:
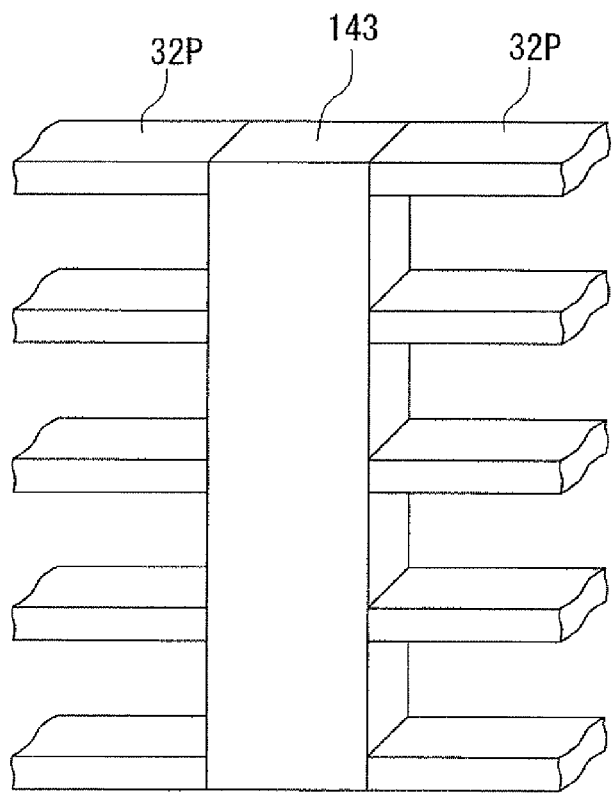
FIG. 34 is a perspective view showing the step of FIG. 33.

Referring to FIG. 33 and FIG. 34, the second modification example will now be described. FIG. 33 is a plan view showing a part of the substructure 120 after the formation of the preliminary wires 143 according to the second modification example. FIG. 34 is a perspective view showing a plurality of preliminary electrodes 32P and a preliminary wire 143 in the substructure 120 shown in FIG. 33. In the second modification example, the respective plurality of preliminary electrodes 32P of two adjacent pre-chip portions 30P are not connected to each other in the position between the two pre-chip portions 30P. Before the formation of the preliminary wires 143 in the substructure 120, the preliminary electrodes 32P are exposed in the wall faces of the holes 133. When the preliminary wires 143 are formed in the holes 133, the preliminary wires 143 are electrically connected to the preliminary electrodes 32P. When the substructure 120 is cut subsequently, the plurality of preliminary wires 143 are split into two sets of a plurality of wires 3a of two separate main bodies 2.

As has been described, in the layered chip package 1 according to the present embodiment, a plurality of wires 3a that constitute wiring 3 are disposed on at least one of the side surfaces of the main body 2 that includes a plurality of semiconductor chips 30 stacked. The method of manufacturing the layered chip package 1 or the substructure 120 according to the present embodiment allows manufacturing, through a small number of steps, a plurality of layered chip packages 1 each having a plurality of wires 3a disposed on at least one of the side surfaces of the main body 2. This is achieved by forming the preliminary wires 143 in the plurality of holes 133 of the substructure 120 before the substructure 120 is cut. According to the present embodiment, it is thus possible to mass-produce the layered chip package 1 at low cost in a short period of time.

If the respective plurality of preliminary electrodes 32P of two adjacent pre-chip portions 30P of the substructure 120 are connected to each other as shown in FIG. 23 and FIG. 24, the present embodiment further provides the following effect. That is, in such a case, the electrodes 32 and the wire 3a have large contact areas therebetween after the cutting of the substructure 120 as shown in FIG. 30 and FIG. 31. This can improve the reliability of the electric connection between the electrodes 32 and the wire 3a.

In the layered chip package 1 according to the present embodiment, the plurality of semiconductor chips 30 included in the main body 2 are electrically connected to each other by the wiring 3 that includes the plurality of wires 3a disposed on at least one of the side surfaces of the main body 2. Consequently, the present embodiment is free from the problems of the wire bonding method, that is, the problem that it is difficult to reduce the distance between electrodes so as to avoid contact between wires, and the problem that the high resistances of the wires hinder the acceleration of operation of the circuit.

As compared with the through electrode method, the present embodiment has the following advantages. First, the present embodiment does not require the formation of through electrodes in each chip and consequently does not require a large number of steps for forming through electrodes in each chip.

According to the present embodiment, electrical connection between the plurality of semiconductor chips 30 is established by the wiring 3 that includes the plurality of wires 3a disposed on at least one of the side surfaces of the main body 2. The present embodiment thus provides higher reliability of electrical connection between chips as compared with the case where through electrodes are used to establish electrical connection between chips.

Furthermore, according to the present embodiment, it is possible to easily change the line width and thickness of the wires 3a that constitute the wiring 3. Consequently, it is possible to easily cope with future demands for finer wires 3a.

The through electrode method requires that the through electrodes of upper and lower chips be connected to each other by means of, for example, soldering at high temperatures. In contrast, according to the present embodiment, it is possible to form the wiring 3 at lower temperatures since the wires 3a are formed by plating. According to the present embodiment, it is also possible to bond the plurality of layer portions 10 to each other at low temperatures. Consequently, it is possible to prevent the semiconductor chips 30 from suffering damage from heat.

The through electrode method further requires accurate alignment between upper and lower chips in order to connect the through electrodes of the upper and lower chips to each other. In contrast, according to the present embodiment, electrical connection between the semiconductor chips 30 is established not at an interface between two vertically adjacent layer portions 10 but through the use of the wiring 3 that includes the plurality of wires 3a disposed on at least one of the side surfaces of the main body 2. The alignment between the plurality of layer portions 10 therefore requires lower accuracy than that required for the alignment between a plurality of chips in the through electrode method.

The main body 2 of the layered chip package 1 according to the present embodiment includes a plurality of terminals 4 that are disposed on at least one of the top surface 2a and the bottom surface 2b. It is thus possible to stack two or more layered chip packages 1 and electrically connect them to each other.

The layered chip package 1 preferably includes a plurality of terminals 4 disposed on both of the top surface 2a and the bottom surface 2b. This makes it possible to stack three or more layered chip packages 1 and electrically connect them to each other.

If a layer portion 10 that includes a defective semiconductor chip 30 is also provided with the plurality of electrodes 32 that electrically connect the semiconductor chip 30 to the wires 3a, there is established a connection between the electrodes 32 and the wiring 3. In such a case, the electrodes 32 connected to the defective semiconductor chip 30 can produce capacitances and inductances that are unnecessary for the device to be implemented by the layered chip package 1, such as a memory device, and/or produce a stray capacitance between themselves and other electrodes 32 connected to a conforming semiconductor chip 30. This hinders the acceleration of operation of the device such as a memory device.

In contrast, according to the present embodiment, the second-type layer portion 10B including a defective semiconductor chip 30 does not have the electrodes 32 that electrically connect the semiconductor chip 30 to the wires 3a. Therefore, in the layered chip package 1, the second-type layer portion 10 which includes a defective semiconductor chip 30 can be regarded as merely an insulating layer. The present embodiment thus makes it possible to disable the use of a defective semiconductor chip 30 and reduce the problems resulting from wiring connected to the defective semiconductor chip 30.

Second Embodiment

Figure 35:
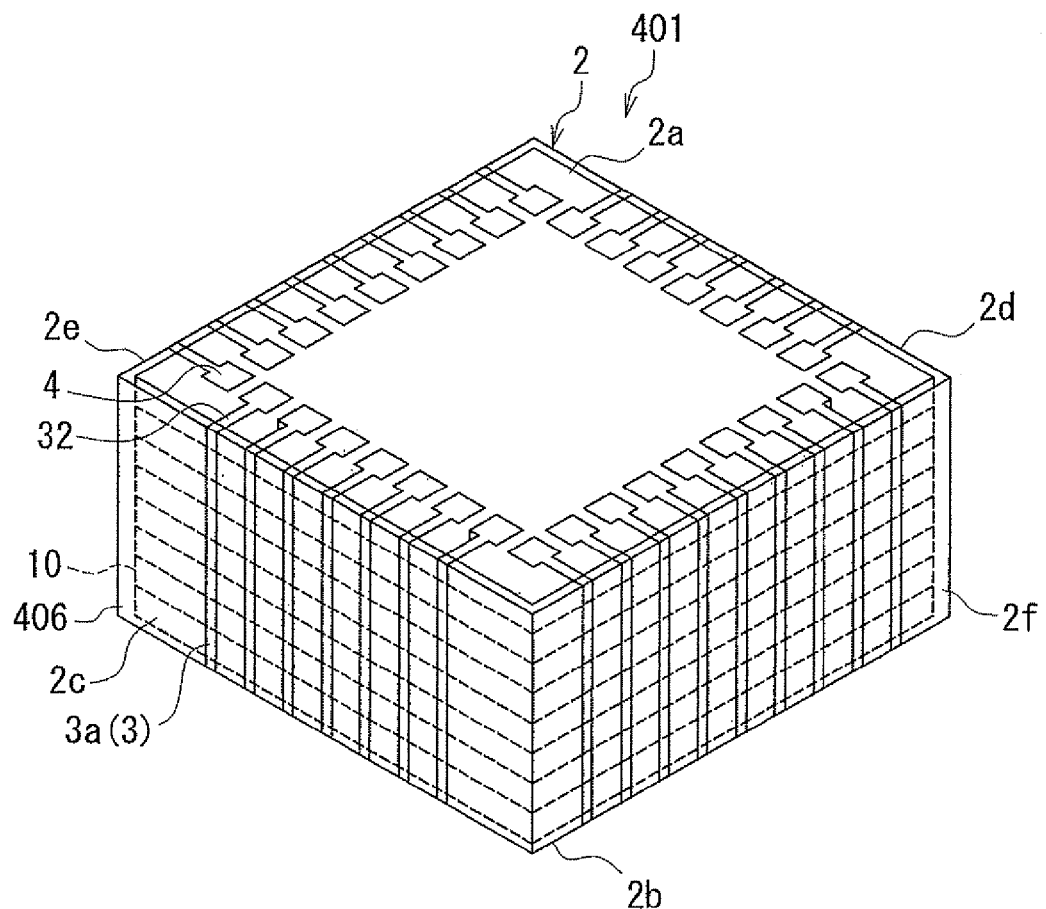
FIG. 35 is a perspective view of a layered chip package according to a second embodiment of the invention.

A second embodiment of the present invention will now be described. FIG. 35 is a perspective view of a layered chip package 401 according to the present embodiment. The main body 2 of the layered chip package 401 according to the present embodiment includes an insulating film 406. The insulating film 406 is disposed outside the insulating layer 31 of each layer portion 10, and forms at least one of the four side surfaces 2c, 2d, 2e, and 2f of the main body 2. In the present embodiment, the insulating layer 31 of each layer portion 10 and the insulating film 406 constitute the insulating portion that covers at least one of the four side surfaces of each of the plurality of semiconductor chips 30 and forms the at least one of the side surfaces of the main body 2 on which the wires 3a are disposed. In the example shown in FIG. 35 in particular, the insulating film 406 forms all the four side surfaces 2c, 2d, 2e, and 2f of the main body 2. The insulating film 406 is formed of a resin, for example.

Figure 36:
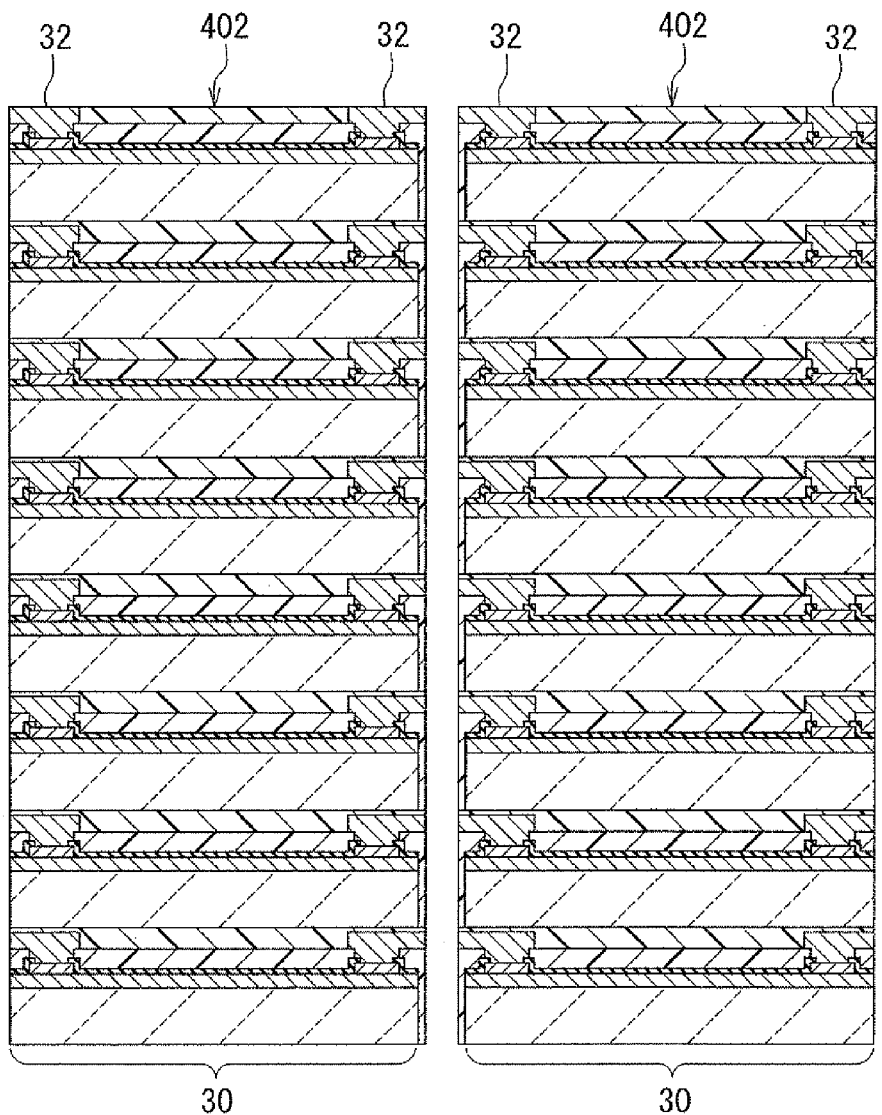
FIG. 36 is a cross-sectional view showing a step of a method of manufacturing the layered chip package according to the second embodiment of the invention.

Next, a method of manufacturing the layered chip package 401 according to the present embodiment will be described. The present embodiment differs from the first embodiment in the step of fabricating the initial substructure. In the present embodiment, the initial substructure 115 of the first embodiment shown in FIG. 20 is cut into a plurality of stacks 402 as shown in FIG. 36. Each stack 402 includes a stack of a plurality of semiconductor chips 30 to be included in the main body 2. Each stack 402 is the same as the main body 2 of the present embodiment excluding the insulating film 406. Each stack 402 has a top surface, a bottom surface, and four side surfaces. Each stack 402 includes a plurality of electrodes 32 that are electrically connected to at least, one of the semiconductor chips 30. The plurality of electrodes 32 are exposed in any of the four side surfaces of the stack 402.

Figure 37:
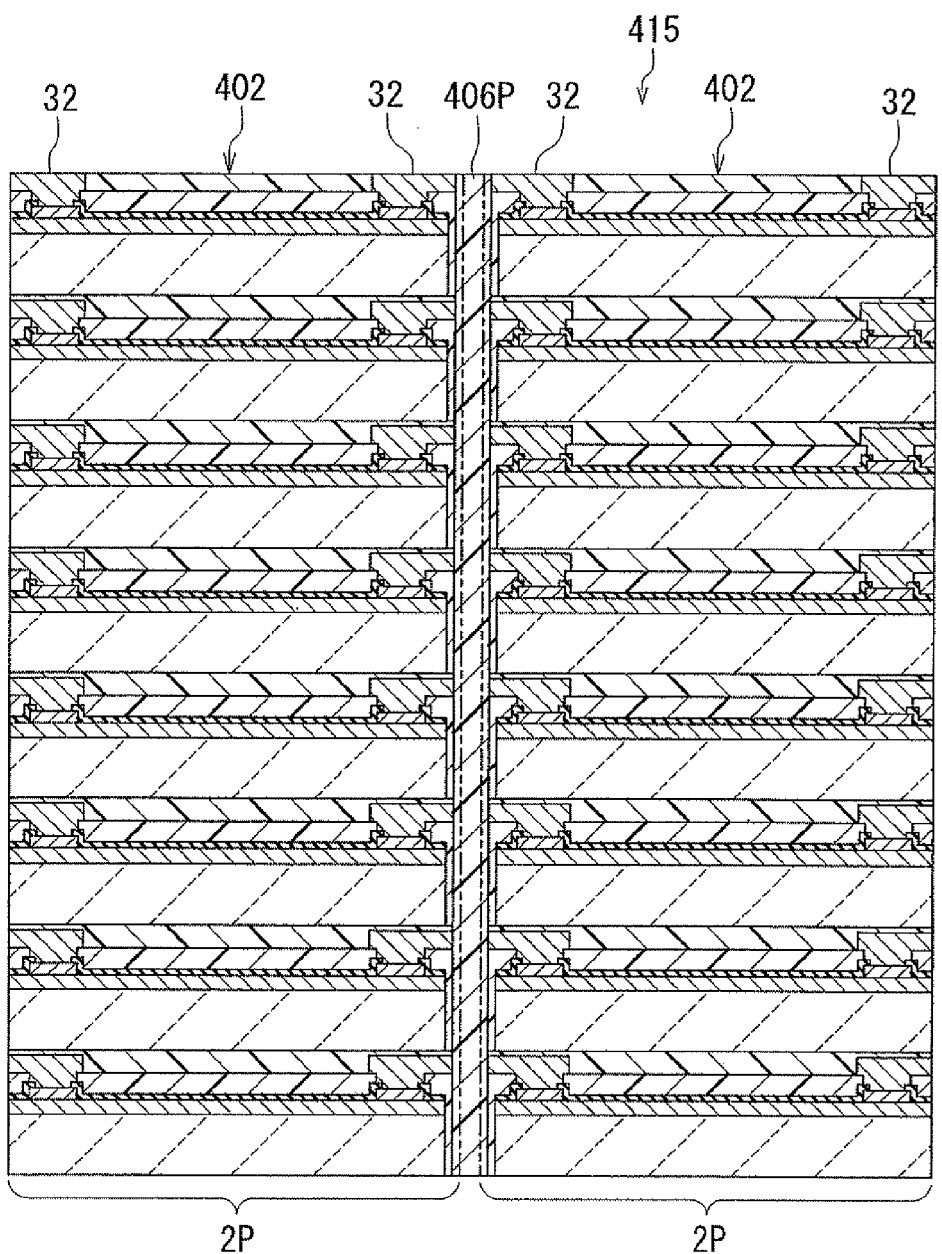
FIG. 37 is a cross-sectional view showing a step that follows the step of FIG. 36.

Next, as shown in FIG. 37, the plurality of stacks 402 are arrayed such that the respective side surfaces of adjacent stacks 402 face each other. An insulting layer 406P that is to become the insulating film 406 later is then formed between adjacent stacks 402 so that the plurality of stacks 402 are connected to each other via the insulating layer 406P. The insulating layer 406P is formed of a resin, for example. An initial substructure 415 of the present embodiment is thereby fabricated. The initial substructure 415 includes an array of a plurality of pre-separation main bodies 2P that are intended to be separated from each other later into individual main bodies 2.

Figure 38:
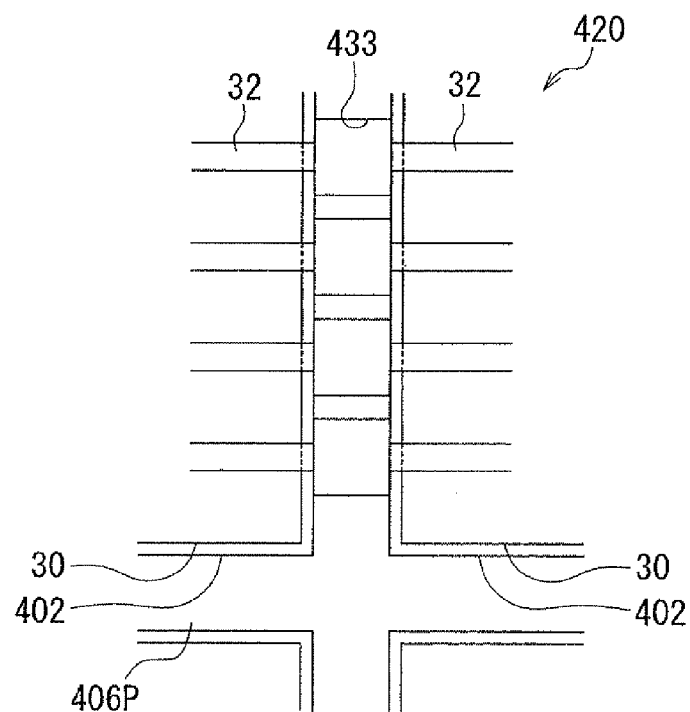
FIG. 38 is a plan view showing a step that follows the step of FIG. 37.
Figure 39:
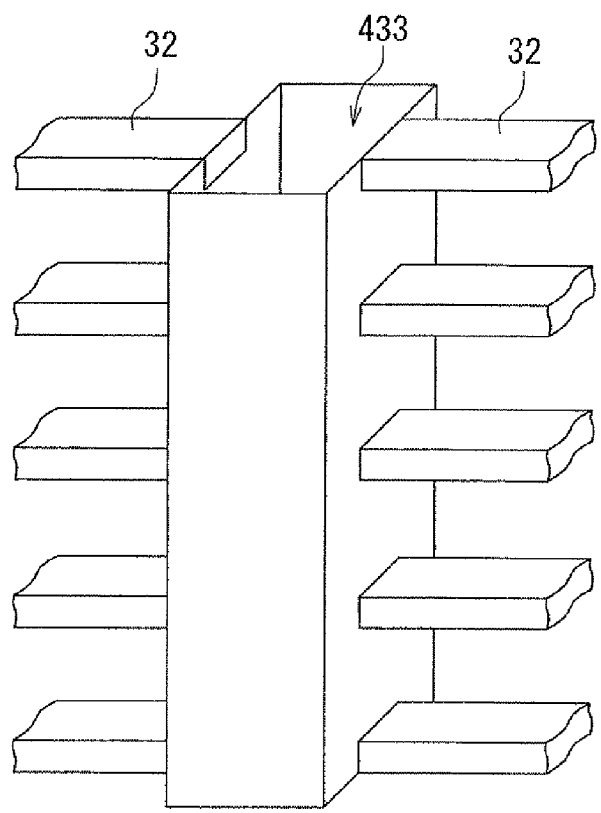
FIG. 39 is a perspective view showing the step of FIG. 38.

Now, with reference to FIG. 38 and FIG. 39, a description will be given of the step of forming a substructure using the initial substructure 415. In this step, a plurality of holes 433 for accommodating a plurality of preliminary wires are formed in the initial substructure 415 at the positions between two adjacent pre-separation main bodies 2P. The initial substructure 415 is thereby made into a substructure 420. FIG. 38 is a plan view showing a part of the substructure 420. FIG. 39 is a perspective view showing a plurality of electrodes 32 and a hole 433 in the substructure 420. The plurality of electrodes 32 are exposed in the wall faces of the hole 433.

Figure 40:
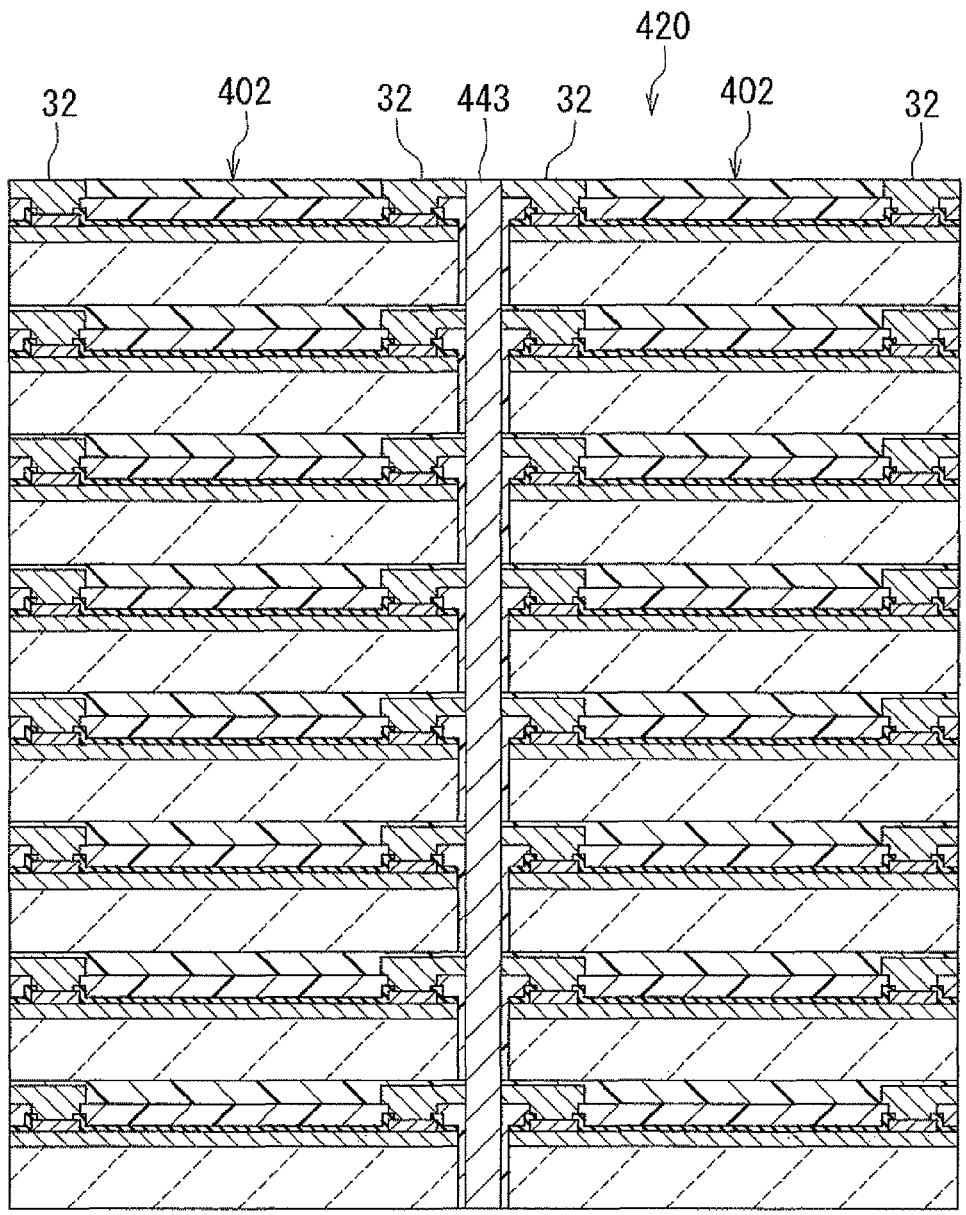
FIG. 40 is a cross-sectional view showing a step that follows the step of FIG. 38.
Figure 41:
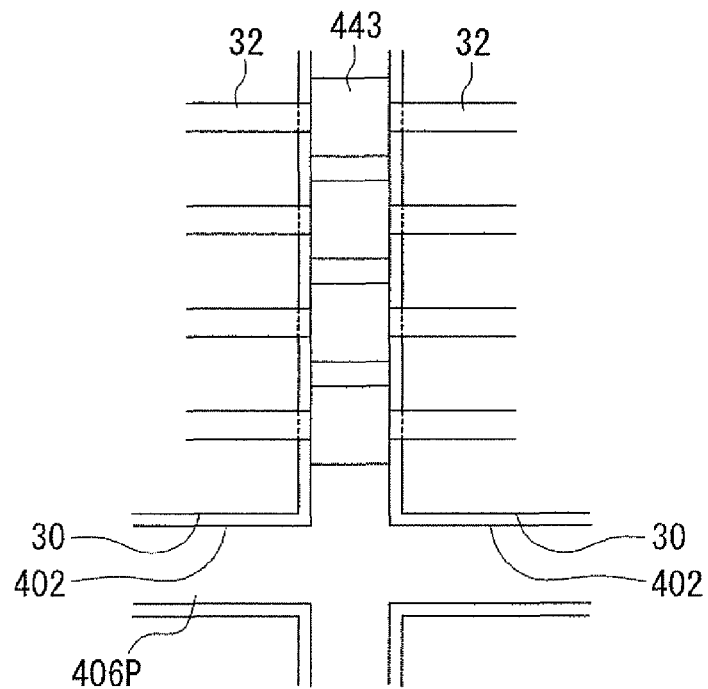
FIG. 41 is a plan view showing the step of FIG. 40.
Figure 42:
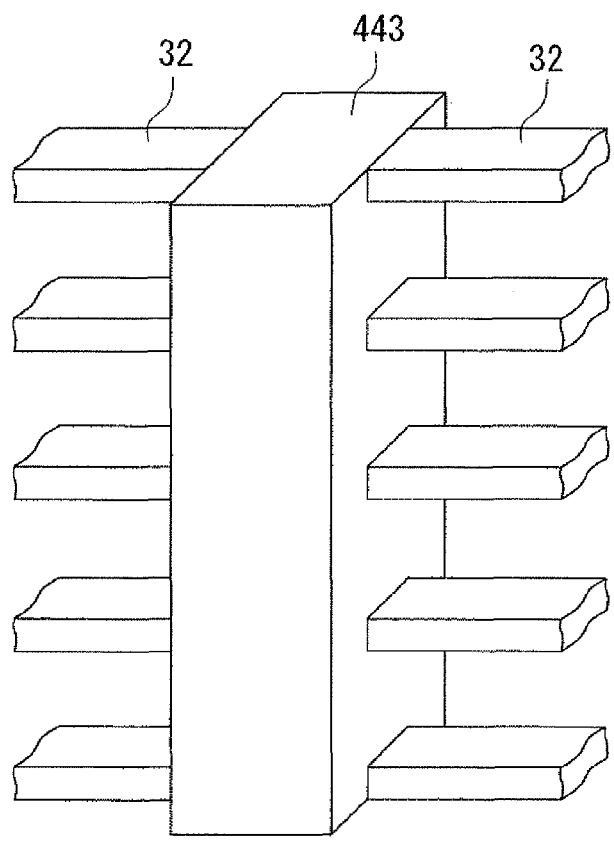
FIG. 42 is a perspective view showing the step of FIG. 40.

Next, the step of forming preliminary wires in the plurality of holes 433 of the substructure 420 by plating will be described with reference to FIG. 40 to FIG. 42. FIG. 40 is a cross-sectional view showing a step that follows the step of FIG. 38. FIG. 41 is a plan view showing the step of FIG. 40. FIG. 42 is a perspective view showing the step of FIG. 40. In this step, the preliminary wires 443 each made of a plating film are respectively formed in the plurality of holes 433 of the substructure 420 by electroplating, as in the step of forming the preliminary wires 143 of the first embodiment. Each single preliminary wire 443 is in contact with a plurality of electrodes 32 that are exposed in the wall faces of a single hole 433.

Figure 43:
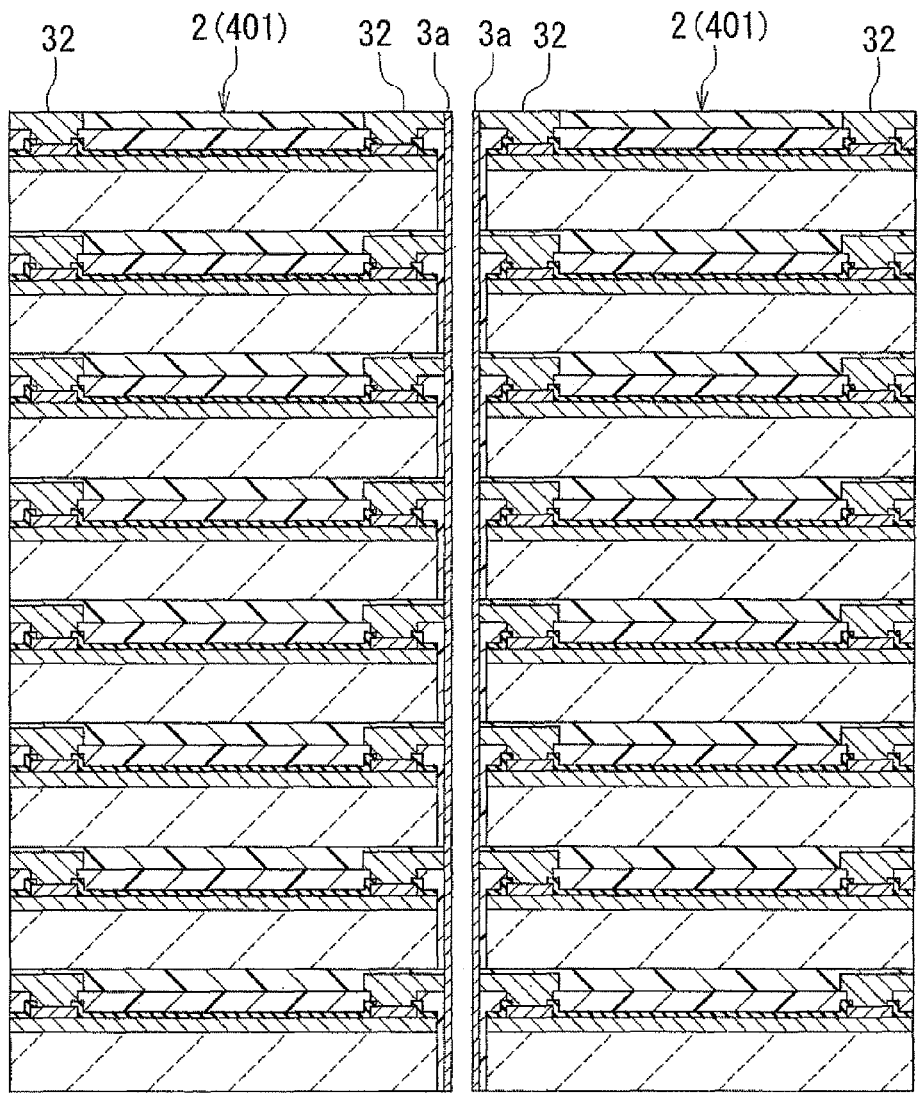
FIG. 43 is a cross-sectional view showing a step that follows the step of FIG. 40.
Figure 44:
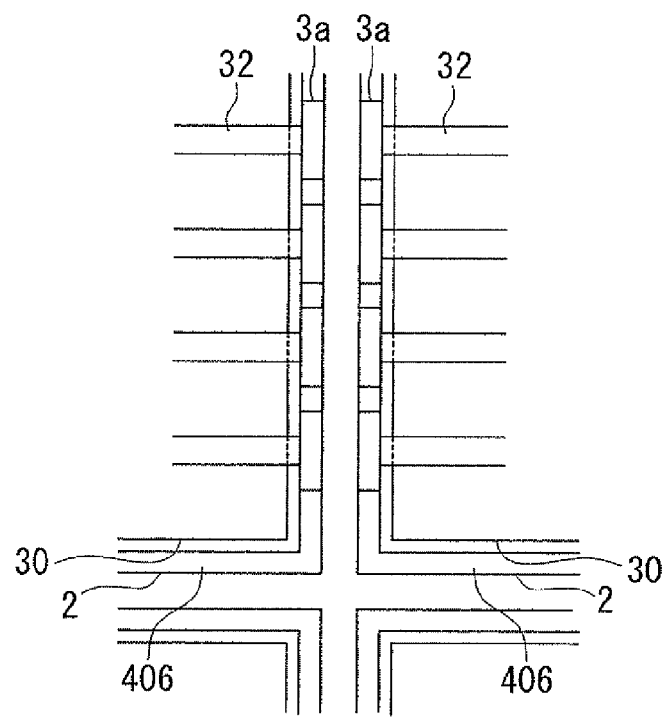
FIG. 44 is a plan view showing a step that follows the step of FIG. 43.
Figure 45:
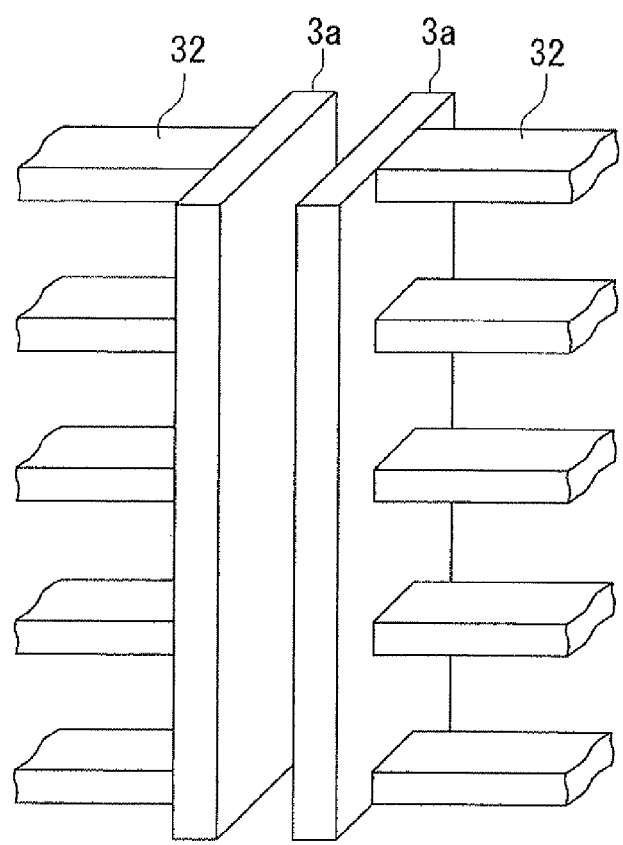
FIG. 45 is a perspective view showing the step of FIG. 43.

Next, the step of cutting the substructure 420 will be described with reference to FIG. 43 to FIG. 45. FIG. 43 is a cross-sectional view showing a step that follows the step of FIG. 40. FIG. 44 is a plan view showing the step of FIG. 43. In this step, as shown in FIG. 43 and FIG. 44, the substructure 420 is cut so that the plurality of pre-separation main bodies 2P are separated from each other and the plurality of preliminary wires 443 are split into two sets of a plurality of wires 3a of two separate main bodies 2, whereby a plurality of layered chip packages 401 are formed. When separated from each other, the plurality of pre-separation main bodies 2P become individual main bodies 2. FIG. 45 shows two wires 3a formed by splitting a single preliminary wire 443 into two. The wires 3a are electrically connected to the plurality of electrodes 32 that are arranged in the direction of stacking of the plurality of layer portions 10 in each main body 2.

The remainder of configuration, function and effects of the present embodiment are similar to those of the first embodiment.

The present invention is not limited to the foregoing embodiment, and various modifications may be made thereto. For example, the foregoing embodiments show an example where the wires 3a constituting the wiring 3 are disposed on the four side surfaces of the main body. The wires 3a may be disposed on only one, two or three of the four side surfaces of the main body, however.

The foregoing embodiments have dealt with the case where the preliminary wires are split into two sets of wires 3a of two separate main bodies 2 in the step of cutting the substructure. In the present invention, however, the preliminary wires may be configured to be cut into the wires 3a of a single main body 2 in the step of cutting the substructure.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A method of manufacturing a plurality of layered chip packages, each of the layered chip packages comprising:
a main body having a top surface, a bottom surface, and four side surfaces; and
wiring that includes a plurality of wires disposed on at least one of the side surfaces of the main body, wherein:
the main body includes: a plurality of semiconductor chips stacked, each of the semiconductor chips having a top surface, a bottom surface, and four side surfaces; an insulating portion that covers at least one of the four side surfaces of each of the plurality of semiconductor chips and forms the at least one of the side surfaces of the main body on which the wires are disposed; and a plurality of electrodes that electrically connect at least one of the semiconductor chips to the wires, the method comprising the steps of:

fabricating a substructure that includes: an array of a plurality of pre-separation main bodies; and a plurality of holes for accommodating a plurality of preliminary wires, the holes being formed between two adjacent pre-separation main bodies;

forming the preliminary wires in the plurality of holes of the substructure by plating; and cutting the substructure so that the plurality of pre-separation main bodies are separated from each other and the preliminary wires are cut into the wires, wherein:

the step of fabricating the substructure includes the steps of:

fabricating an initial substructure; and forming the plurality of holes in the initial substructure;

the step of fabricating the initial substructure includes the steps of:

fabricating a pre-array wafer by subjecting a semiconductor wafer having a top surface, a bottom surface, and four side surfaces, the top surface and bottom surface facing toward opposite directions, to processing of forming a plurality of devices at the top surface, the pre-array wafer including an array of a plurality of pre-semiconductor-chip portions each of which includes a corresponding one of the plurality of devices, the pre-array wafer having a top surface and a bottom surface corresponding to the top surface and bottom surface of the semiconductor wafer;

forming a plurality of grooves in the pre-array wafer so as to define respective areas of the plurality of pre-semiconductor-chip portions, the plurality of grooves opening in the top surface of the pre-array wafer and being formed such that bottoms of the plurality of grooves do not reach the bottom surface of the pre-array wafer;

forming an insulating layer to fill the plurality of grooves;

forming a chip array by polishing the bottom surface of the pre-array wafer until the plurality of grooves are exposed; and forming the initial substructure by stacking a plurality of chip arrays, wherein the step of forming the plurality of holes in the initial substructure forms the plurality of holes such that each of the plurality of holes penetrates all of the insulating layers of the plurality of chip arrays.

2. The method of manufacturing the layered chip packages according to claim 1, wherein, in the step of cutting the substructure, the preliminary wires are split into two sets of wires of two separate main bodies.

3. The method of manufacturing the layered chip packages according to claim 2, wherein:

each of the plurality of pre-separation main bodies includes a plurality of preliminary electrodes;

in the substructure, the respective plurality of preliminary electrodes of two adjacent pre-separation main bodies are connected to each other; and the respective plurality of preliminary electrodes of the two pre-separation main bodies connected to each other are separated from each other into the respective plurality of electrodes of two separate main bodies after the substructure is cut.

4. The method of manufacturing the layered chip packages according to claim 1, wherein the insulating portion is formed of a resin.

* * * * *